(12) United States Patent
Furuta et al.

(10) Patent No.: US 9,130,159 B2
(45) Date of Patent: Sep. 8, 2015

(54) METHOD OF FABRICATING ELEMENT INCLUDING NANOGAP ELECTRODES

(75) Inventors: Shigeo Furuta, Tsukuba (JP); Touru Sumiya, Tsukuba (JP); Yuichiro Masuda, Tsukuba (JP); Tsuyoshi Takahashi, Tsukuba (JP); Yutaka Hayashi, Tsukuba (JP); Masatoshi Ono, Tsukuba (JP)

(73) Assignee: Funai Electric Co., Ltd., Daito-Shi (JP)

( * ) Notice: Subject to any disclaimer, the term of this patent is extended or adjusted under 35 U.S.C. 154(b) by 792 days.

(21) Appl. No.: 12/756,522

(22) Filed: Apr. 8, 2010

(65) Prior Publication Data

US 2010/0257726 A1 Oct. 14, 2010

(30) Foreign Application Priority Data

Apr. 10, 2009 (JP) ................................. 2009-095575

(51) Int. Cl.
*H01H 11/00* (2006.01)
*H01H 65/00* (2006.01)
*H01L 45/00* (2006.01)

(52) U.S. Cl.
CPC ............ *H01L 45/1233* (2013.01); *H01L 45/04* (2013.01); *H01L 45/16* (2013.01); *Y10T 29/49082* (2015.01); *Y10T 29/49105* (2015.01)

(58) Field of Classification Search
CPC ..... H01L 27/2463; H01L 45/04; H01L 45/12; H01L 45/124; H03K 17/58; H03K 19/10; H01H 1/0094; G11C 13/0002; G11C 2213/11; Y10T 29/49105
USPC ............ 29/622, 829, 830, 831, 846; 314/115, 314/116, 135; 438/379
See application file for complete search history.

(56) References Cited

U.S. PATENT DOCUMENTS 4,816,098 A * 3/1989 Davis et al. .............. 156/345.31
2005/0127792 A1 * 6/2005 Mehta .......................... 310/332
(Continued)

FOREIGN PATENT DOCUMENTS

| EP | 2 028 693 A2 | 2/2009 |
|---|---|---|
| JP | 2000-343708 A | 12/2000 |
| JP | 2005-79335 A | 3/2005 |

(Continued)

OTHER PUBLICATIONS

Eike Ruttkowski, et al., "CMOS based arrays of nanogap devices for molecular electronics", 5th IEEE Conference on Nanotechnology, Jul. 11-15, 2005, Nagoya, Japan, pp. 592-595 (XP010831552).
Extended European Search Report dated Apr. 18, 2013 (seven (7) pages).

*Primary Examiner* — Peter DungBa Vo
*Assistant Examiner* — Jeffrey T Carley
(74) *Attorney, Agent, or Firm* — Crowell & Moring LLP

(57) ABSTRACT

Disclosed is a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method comprising: forming the first electrode; forming a spacer on an upper surface of the first electrode; forming the second electrode in contact with an upper surface of the spacer; and removing the spacer to form the gap.

8 Claims, 25 Drawing Sheets

(56) References Cited

U.S. PATENT DOCUMENTS

2006/0154467 A1     7/2006   Hoffman et al.
2006/0157802 A1*   7/2006   Sakamoto et al. ............ 257/393

FOREIGN PATENT DOCUMENTS

| | | |
|---|---|---|
| JP | 2008-243986 | 10/2008 |
| WO | WO 03/028124 A1 | 4/2003 |

* cited by examiner

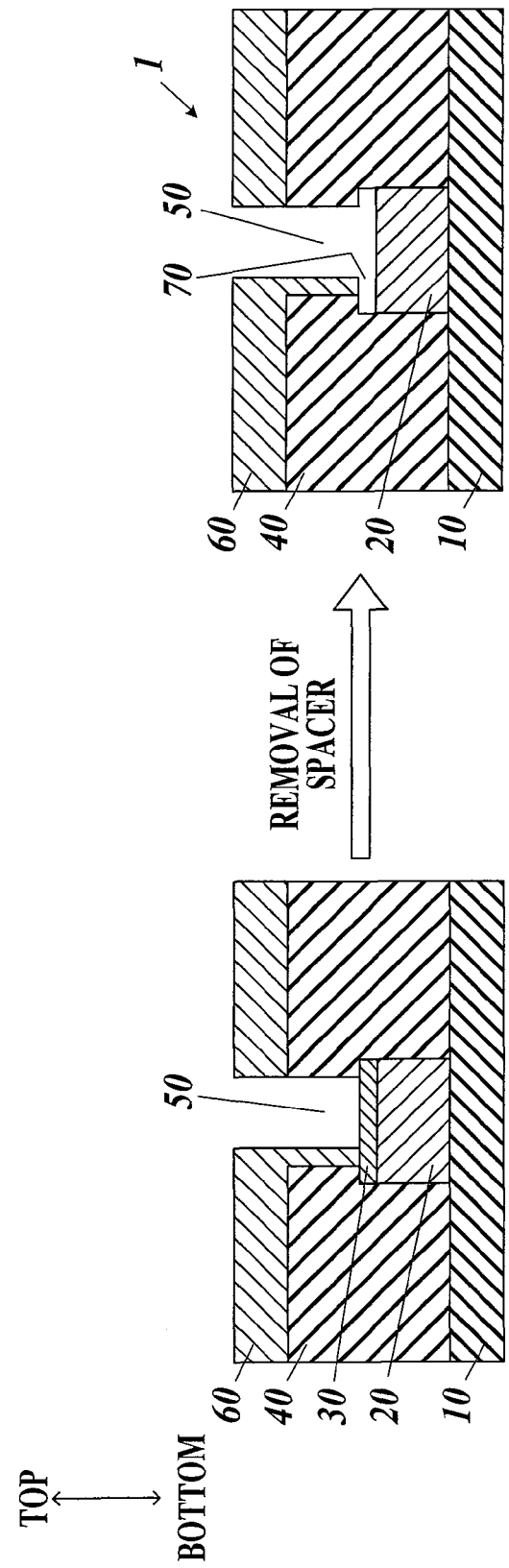

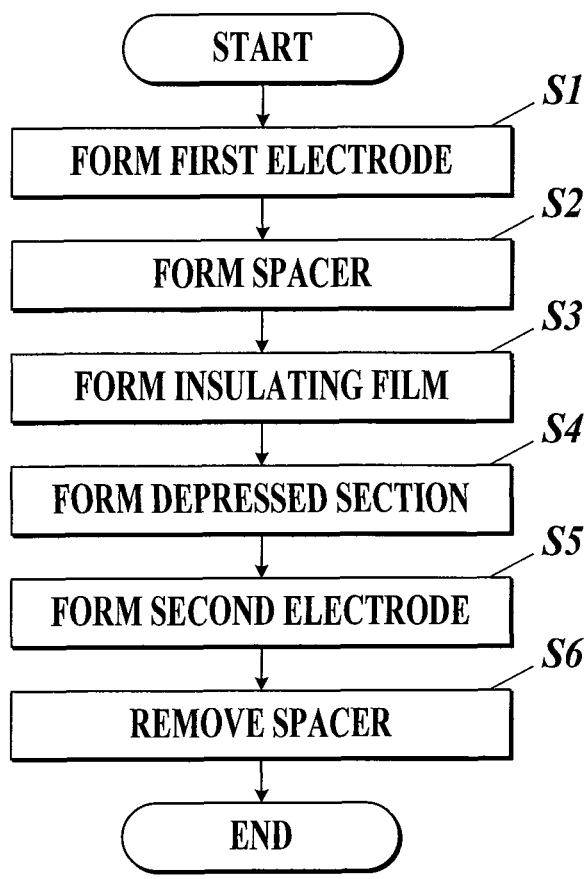

METHOD OF FABRICATING ELEMENT INCLUDING NANOGAP ELECTRODES

BACKGROUND OF THE INVENTION

1. Field of the Invention

The present invention relates to a method of fabricating an element including nanogap electrodes.

2. Description of Related Art

Lately, devices have become smaller and more highly dense, and there is a demand for a finer electric element. As one example, there is a known element where voltage is applied between two elements with a fine gap (nanogap) therebetween to enable switching operation.

Specifically, for example, an element is developed including silicon oxide and gold which are stable material and the element is fabricated by a simple fabricating method called shadow evaporation. The element can be repeatedly used stably in switching operation (for example, Japanese Patent Application Laid-Open Publication No. 2005-79335).

Also, for example, an element which can be integrated at a higher density and which is more easier to integrate is developed, and the element includes two electrodes aligned vertically with a nanogap therebetween (for example, Japanese Patent Application Laid-Open Publication No. 2008-243986). Specifically, the element described above is fabricated by the following steps for example, (a) forming a lower electrode (first electrode) on an upper surface of an insulating substrate, (b) forming an insulating film so as to cover the first electrode, (c) forming a depressed section (depressed section on hole) on the insulating film to expose a portion of the upper surface of the first electrode (d) forming an upper electrode (second electrode) in the opening section and inside the depressed section on the upper surface of the insulating film by shadow evaporation and with this, nanogap electrodes are formed.

However, in the element described in Japanese Patent Application Laid-Open Publication No. 2008-243986, the depressed section is fabricated by forming a resist pattern on an insulating film using a device to expose light, etc., and then etching only portions on the insulating film where the resist pattern is not formed. Due to the influence of variation of light exposure and variation of etching, variation of shape of the depressed section occurs. Also, in the element described in Japanese Patent Application Laid-Open Publication No. 2008-243986, the electrodes are fabricated by shadow evaporation and due to the influence of variation of shadowing angle in shadow evaporation, variation of the shapes of the electrodes occurs. Therefore, there is a problem that it is difficult to perform mass production of elements including nanogap electrodes with a certain distance therebetween due to the influence of variation in fabrication.

SUMMARY OF THE INVENTION

It is, therefore, a main object of the present invention to provide a fabrication method of an element including nanogap electrodes, in which an element including nanogap electrodes with a certain distance therebetween can be easily mass produced.

According to a first aspect of the present invention, there is provided a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method including:

forming the first electrode;
forming a spacer on an upper surface of the first electrode;
forming the second electrode in contact with an upper surface of the spacer; and
removing the spacer to form the gap.

According to a second aspect of the present invention, there is provided a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method including:

forming a first electrode layer;
forming a spacer layer on an upper surface of the first electrode layer;
forming a spacer and the first electrode including the spacer on an upper surface of the first electrode from the first electrode layer and the spacer layer;
forming the second electrode in contact with an upper surface of the spacer; and
removing the spacer to form the gap.

According to a third aspect of the present invention, there is provided a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method including:

forming a first electrode layer;
forming a stopper layer on an upper surface of the first electrode layer;
forming a stopper and the first electrode including the stopper on the upper surface of the first electrode from the first electrode layer and the stopper layer;
forming an insulating film to cover the stopper and the first electrode including the stopper on the upper surface of the first electrode;
forming a first depressed section on the insulating film to expose an upper surface of the stopper;
forming a second depressed section on the stopper to expose the upper surface of the first electrode;
forming a spacer on the upper surface of the first electrode exposed by the second depressed section;
forming the second electrode to be in contact with an upper surface of the spacer; and
removing the spacer to form the gap.

BRIEF DESCRIPTION OF THE DRAWINGS

The above and other objects, advantages, and features of the present invention will become more fully understood from the detailed description given hereinbelow and the appended drawings which are given by way of illustration only, and thus are not intended as a definition of the limits of the present invention, and wherein:

FIG. 1 is a front cross sectional view showing an example of a configuration of an element including nanogap electrodes fabricated by a fabrication method of the present embodiment;

FIG. 2 is a flowchart explaining a fabrication method of the present embodiment;

DESCRIPTION OF THE PREFERRED EMBODIMENTS

Figure 3A:
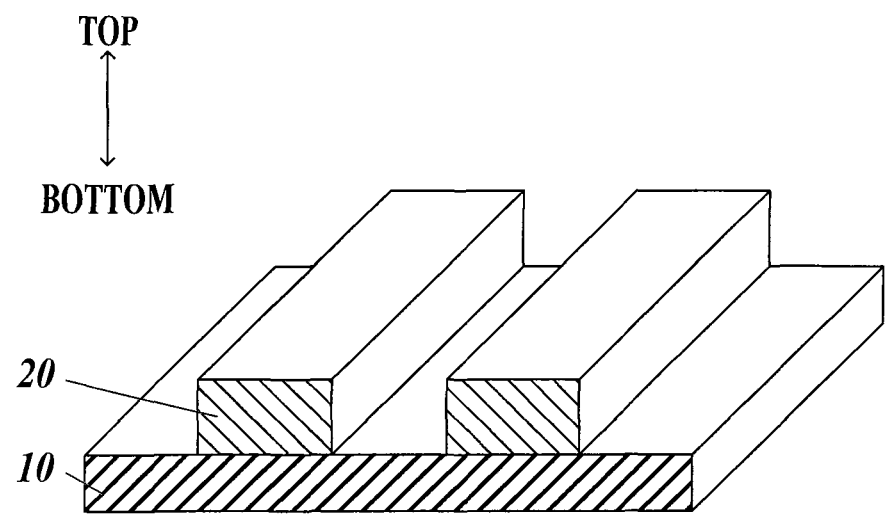
FIG. 3A is a front perspective cross sectional view explaining a first electrode forming step of the fabrication method of the present embodiment.

The best mode for carrying out the present invention will be explained in detail with reference to the drawings.

However, the scope of the invention is not limited to the illustrated examples.

<Configuration of Element Including Nanogap Electrodes>

An element 1 (hereinafter referred to as "nanogap element 1") including nanogap electrodes fabricated by the fabrication method of the present embodiment includes, for example, as shown in the right figure of FIG. 1, insulating substrate 10, first electrode 20 provided on an upper surface of the insulating substrate 10, insulating film 40 provided on an upper surface of the insulating substrate 10 so as to cover the first electrode 20 with a gap to be separated from the upper surface of the first electrode 20, a depressed section 50 provided on the insulating film 40 to expose a portion of the upper surface of the first electrode 20, a second electrode 60 supported by the insulating film 40 and provided above the first electrode 20 and gap 70 with an order in a unit of nanometers provided between the first electrode 20 and the second electrode 60.

Here, the first electrode 20 and the second electrode 60 are positioned separated by a fine gap 70 (nanogap) and compose nanogap electrodes.

Specifically, for example, as shown in FIG. 1, the nanogap element 1 (element of right figure of FIG. 1) is fabricated by removing a spacer 30 to form a gap 70 from an element (element of left figure of FIG. 1) configured including, the insulating substrate 10, the first electrode 20 provided in contact with the upper surface of the insulating substrate 10, spacer 30 provided in contact with the upper surface of the first electrode 20, the insulating film 40 provided so as to be in contact with the upper surface of the insulating substrate 10 and the upper surface of the spacer 30 and to cover the spacer 30 and the first electrode 20 including the spacer 30 on its upper surface, the depressed section 50 provided on the insulating film 40 to expose a portion of the upper surface of the spacer 30, and the second electrode 60 provided so as to be in contact with the upper surface of the insulating film 40, inner face of the depressed section 50 and part of the portion of the upper surface of the spacer 30 exposed by the depressed section 50.

In other words, thickness of the spacer 30 is a size of the gap 70 provided between the two electrodes (first electrode 20 and second electrode 60) of the nanogap element 1.

Therefore, the gap 70 with a desired size can be formed without influence of fabrication variation and with high reproducibility.

With the conventional fabricating method, due to the influence of variation of exposure to light and variation of etching, variation in the shape of the depressed section occurred. Also, due to the influence of variation in shadowing angle in the shadow evaporation, variation in shape of electrodes occurred. Therefore, it was difficult to form a certain distance between the nanogap electrodes. Thus, reproducibility was low. Also, it was difficult to control the distance between the nanogap electrodes.

With the fabrication method of the present invention, the distance between the nanogap electrodes (size of gap 70) depends on only the thickness of the spacer 30 and does not depend on the shape of the depressed section 50 or the shape of the electrode 20 or 60. The size of the gap 70 does not receive the influence of fabrication variation such as variation of light exposure, variation of etching, variation of shadowing angle, etc., and therefore high reproducibility can be achieved and also it is easy to control distance between the nanogap electrodes. Especially, with the present technique, the thickness (film thickness) of the spacer 30 can be controlled at a level of 0.1 nm, and even when the nanogap element 1 is mass produced (specifically, for example, when the nanogap element 1 is fabricated in orders of billions), the nanogap element 1 with a certain distance between the nanogap electrodes and with a desired distance between the nanogap electrodes can be fabricated.

With the gap 70, the resistive state switches by applying predetermined voltage between the first electrode 20 and the second electrode 60 and the gap 70 is provided with a function to realize a switching phenomenon (switching phenomenon of a resistive state) of the nanogap element 1.

Therefore, the thickness of the spacer 30 is not limited and can be any thickness which can form the gap 70 including a size where the resistive state is switched when the predetermined voltage is applied between the first electrode 20 and the second electrode 60.

Specifically, the size (G) of the gap 70 can be determined freely to any size where the resistive state is switched when the predetermined voltage is applied between the first electrode 20 and the second electrode 60 and for example, it is preferable that the size is $0$ nm$<G\leq 13$ nm and even more preferable that the size is $0.8$ nm$<G<2.2$ nm.

The reason why the maximum value of the size G is 13 nm is because when the size G is larger than 13 nm, the resistive state is not switched by applying the predetermined voltage between the first electrode 20 and the second electrode 60.

The minimum value of the size G is to be larger than 0 nm because when the value is 0 nm, the first electrode 20 and the second electrode 60 is short circuited. Although the minimum value is difficult to determine by measurement with a microscope, the distance can be said to be the minimum distance where a tunnel current occurs. In other words, the minimum value is the theoretical value of the distance where a quantum mechanical tunnel current can be observed without current-voltage characteristics obeying Ohm's law when the nanogap element 1 operates.

When the resistance value is substituted in the theoretical formula of the tunnel current, the range of $0.8$ nm$<G<2.2$ nm can be obtained as the calculated result of the size G.

The spacer 30 is removed using for example, a predetermined etching gas. Here, a predetermined etching gas is a gas which etches the spacer 30, but does not etch sections (insulating substrate 10, first electrode 20, insulating film 40 and second electrode 60) composing the nanogap element 1.

Therefore, material of the spacer 30, material of each section composing the nanogap element 1, type of etching gas to remove the spacer 30, etc. is not limited if only the spacer 30 can be selectively removed.

The insulating substrate 10 includes a function as a support for providing the electrode (first electrode 20) of the nanogap element 1.

The configuration of the insulating substrate 10 is not limited and for example, the shape of the surface of the insulating substrate 10 can be level or uneven.

Also, the material of the insulating substrate 10 is not limited if the insulating substrate 10 is not etched when the spacer 30 is removed (etched). Specifically, the insulating substrate 10 can be, for example a semiconductor substrate such as Si provided with an oxide film, etc. on its surface or the insulating substrate 10 can be a substrate in which the substrate itself is insulating. Also, as material of the insulating substrate 10, it is preferable to use glass, oxides such as silicon oxide ($SiO_2$), etc., nitrides such as silicon nitride ($Si_xN_y$, $Si_xO_yN_z$, etc.), or the like and among these, silicon oxide ($SiO_2$) is preferable because adhesion with the first electrode 20 is high and degree of freedom in fabrication is high.

The first electrode 20 is to be a pair with the second electrode 60 and a predetermined voltage is applied so as to allow the nanogap element 1 to perform the switching operation (switching operation of resistive state).

The shape of the first electrode 20 is not limited and can be suitably modified.

Also, the material of the first electrode 20 is not limited if the first electrode 20 is not etched when the spacer 30 is removed (etched). Specifically, it is preferable that the material of the first electrode 20 is selected from at least one of, for example, gold, silver, platinum, palladium, nickel, aluminum, cobalt, chrome, rhodium, copper, tungsten, tantalum, carbon, germanium and alloys thereof. Here, in order to strengthen adhesion of the first electrode 20 with insulating substrate 10 and insulating film 40, for example, two or more overlapping layers of different metal can be used. Specifically, for example, the first electrode 20 can be a laminated (multi-layer) configuration of chrome and gold. Of course, the first electrode 20 can be an electrode made from electrode material other than metal.

The insulating film 40 functions as a support to provide the two electrodes (first electrode 20 and second electrode 60) of the nanogap element 1 apart.

The configuration of the insulating film 40 is not limited and for example, the shape of the surface of the insulating film 40 can be level or uneven.

Also, the material of the insulating film 40 is not limited if the insulating film 40 is not etched when the spacer 30 is removed (etched). Specifically, as material of the insulating film 40, it is preferable to use glass, oxides such as silicon oxide ($SiO_2$), etc., nitrides such as silicon nitride ($Si_xN_y$, $Si_xO_yN_z$, etc.), or the like and among these, silicon oxide ($SiO_2$) is preferable because adhesion with the first electrode 20 and the second electrode 60 is high and degree of freedom in fabrication is high. Also, the insulating film 40 can be formed by overlapping two or more layers of different material.

The second electrode 60 is to be a pair with the first electrode 20 and a predetermined voltage is applied so as to allow the nanogap element 1 to perform the switching operation (switching operation of resistive state).

The shape of the second electrode 60 is not limited and can be suitably modified.

Also, the material of the second electrode 60 is not limited if the second electrode 60 is not etched when the spacer 30 is removed (etched). Specifically, it is preferable that the material of the second electrode 60 is selected from at least one of, for example, gold, silver, platinum, palladium, nickel, aluminum, cobalt, chrome, rhodium, copper, tungsten, tantalum, carbon, germanium and alloys thereof. Here, in order to strengthen adhesion of the second electrode 60 with insulating film 40, for example, two or more overlapping layers of different metal can be used. Specifically, for example, the second electrode 60 can be a laminated (multi-layer) configuration of chrome and gold. Of course, the second electrode 60 can be an electrode made from electrode material other than metal.

<Fabrication Method of Element Including Nanogap Electrodes>

Next, the fabrication method of the nanogap element 1 is described with reference to the flowchart shown in FIG. 2.

In the present embodiment, as the fabrication method of the nanogap element 1, for example, the fabrication method of the nanogap element 1 arranged in an array (two dimensional array) as shown in FIG. 3 to FIG. 8 is described as an example.

FIG. 3 to FIG. 8 shows a fabrication method of a nanogap element 1 arranged in a 2×2 array. Of course, the nanogap element 1 fabricated by the fabrication method of the present embodiment can be a single one (for example, nanogap element 1 shown in FIG. 1) not arranged in an array or arranged in an array other than 2×2.

As shown in FIG. 2, the fabrication method of the nanogap element 1 includes, for example, [1] first electrode forming step (step S1), [2] spacer forming step (step S2), [3] insulating film forming step (step S3), [4] depressed section forming step (step S4), [5] second electrode forming step (step S5) and [6] spacer removing step (step S6).

[1] First Electrode Forming Step (Step S1)

Figure 3B:
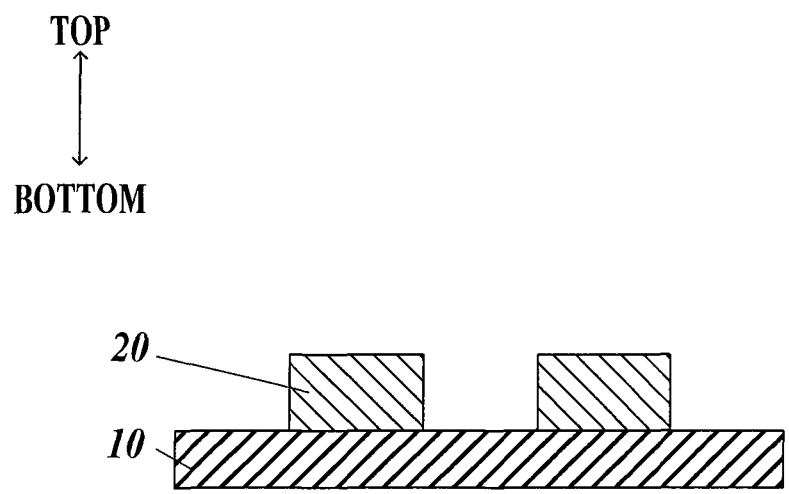
FIG. 3B is a front cross sectional view explaining a first electrode forming step of the fabrication method of the present embodiment.

For example, as shown in FIG. 3, the first electrode forming step is a step to form the first electrode 20.

Specifically, for example, in the first electrode forming step, a plurality of first electrodes 20 are formed on the upper surface of the insulating substrate 10 parallel in a line at a predetermined interval.

More specifically, for example, by using a light exposure device, etc., a first resist pattern to form the first electrode 20 and the spacer 30 is formed on the upper surface of the insulating substrate 10. Next, the first electrode 20 is formed in a portion where the first resist pattern is not formed on the upper surface of the insulating substrate 10 by using a predetermined evaporation device.

[2] Spacer Forming Step (Step S2)

Figure 4A:
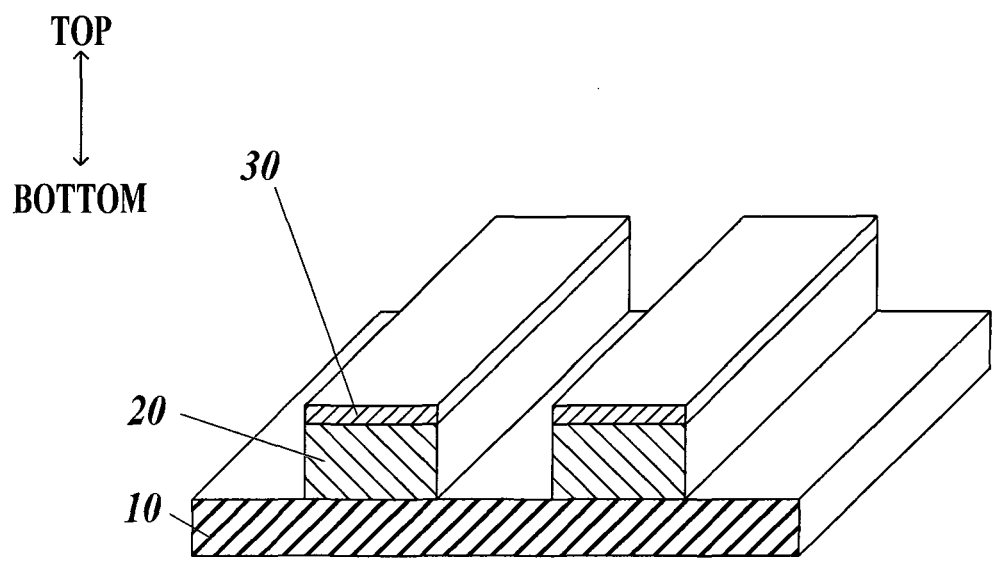
FIG. 4A is a front perspective cross sectional view explaining a spacer forming step of the fabrication method of the present embodiment.
Figure 4B:
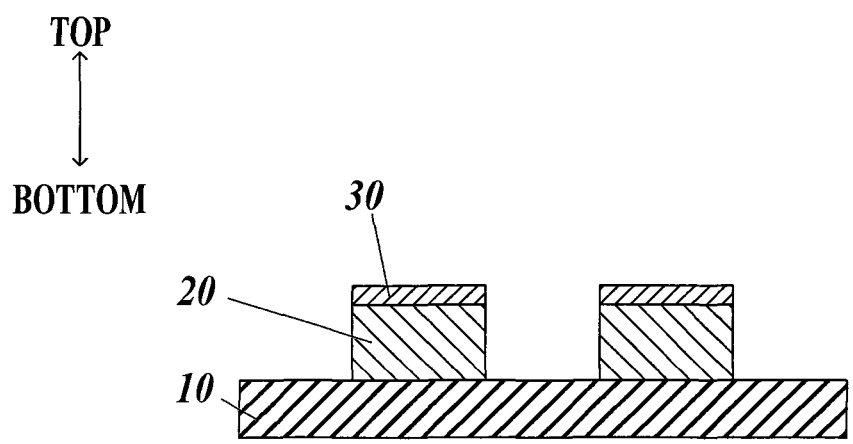
FIG. 4B is a front cross sectional view explaining a spacer forming step of the fabrication method of the present embodiment.

For example, as shown in FIG. 4, the spacer forming step is a step to form the spacer 30 on the upper surface of the first electrode 20.

More specifically, for example, the spacer 30 is formed on substantially the entire upper surface of the first electrode 20 using PECVD (Plasma Enhanced Chemical Vapor Deposition), or the like. Next, only the first resist pattern is removed by using a peeling liquid suitable for the material of the first resist pattern.

[3] Insulating Film Forming Step (Step S3)

Figure 5A:
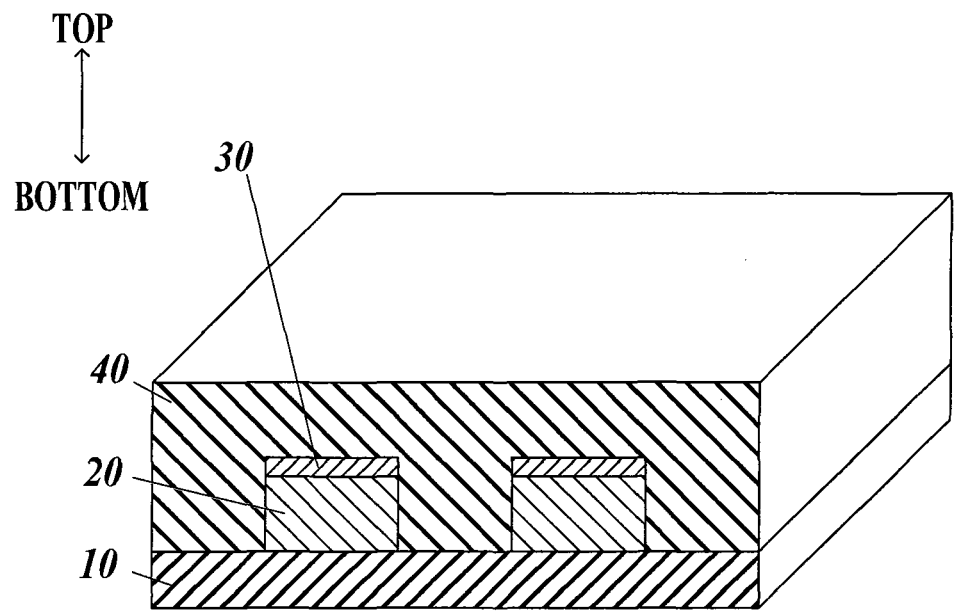
FIG. 5A is a front perspective cross sectional view explaining an insulating film forming step of the fabrication method of the present embodiment.
Figure 5B:
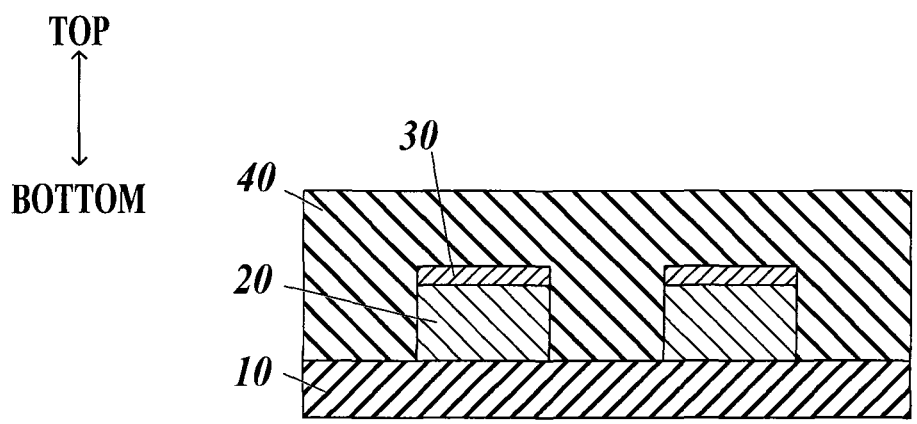
FIG. 5B is a front cross sectional view explaining an insulating film forming step of the fabrication method of the present embodiment.

For example, as shown in FIG. 5, the insulating film forming step is a step to form the insulating film 40 to cover the spacer 30 and the first electrode 20 including the spacer 30 on its upper surface.

More specifically, for example, the insulating film 40 is formed on substantially the entire upper surface of the insulating substrate 10 using PECVD or the like.

[4] Depressed Section Forming Step (Step S4)

Figure 6A:
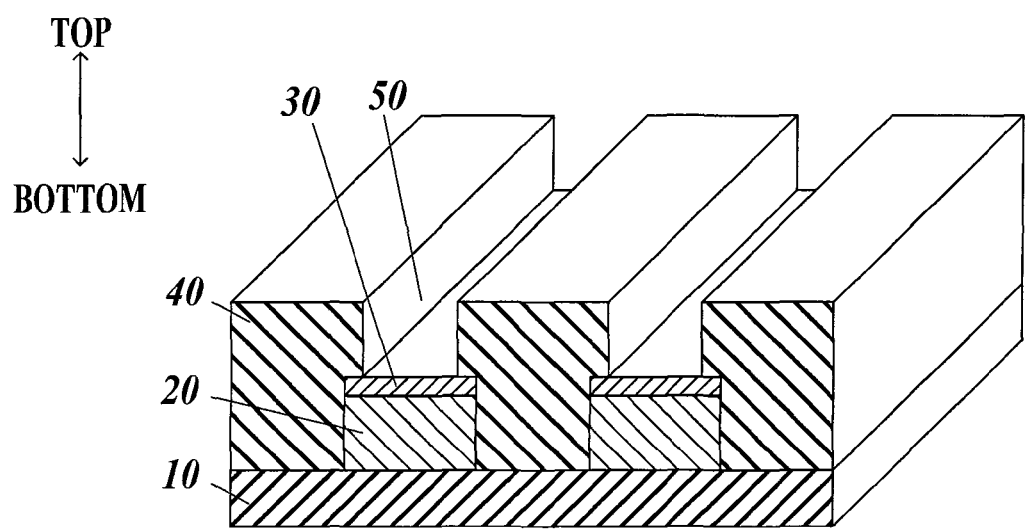
FIG. 6A is a front perspective cross sectional view explaining a depressed section forming step of the fabrication method of the present embodiment.
Figure 6B:
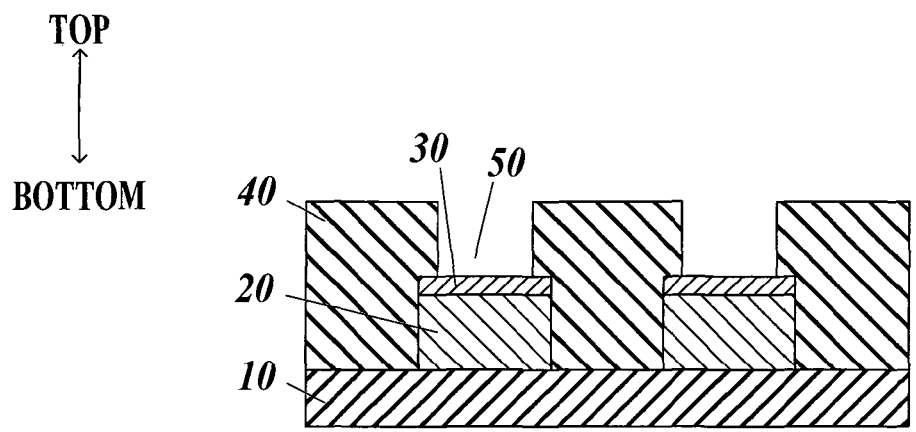
FIG. 6B is a front cross sectional view explaining a depressed section forming step of the fabrication method of the present embodiment.

For example, as shown in FIG. 6, the depressed section forming step is a step to form the depressed section 50 on the insulating film 40 to expose a portion of the upper surface of the spacer 30.

Specifically, for example, in the depressed section forming step, a plurality of depressed sections 50 are formed parallel in a line along the line of the first electrode 20.

More specifically, a second resist pattern to form the depressed section 50 is formed on the upper surface of the insulating film 40 using, for example, a light exposure device, etc. Next, an etching gas suitable for the material of the insulating film 40 is used to selectively remove only the portion where the second resist pattern is not formed on the insulating film 40 to form the depressed section 50. Next, the peeling liquid suitable for the material of the second resist pattern is used to remove only the second resist pattern.

Here, etching gas suitable for the material of the insulating film 40 is not limited if the gas etches the insulating film 40 but does not etch the spacer 30. Specifically, for example, when the insulating film 40 is formed from silicon oxide (SiO$_2$) and the spacer 30 is formed from silicon nitride (for example SiN), gas such as C$_4$F$_8$ can be preferably used as the etching gas suitable for the material of the insulating film 40.

[5] Second Electrode Forming Step (Step S5)

Figure 7A:
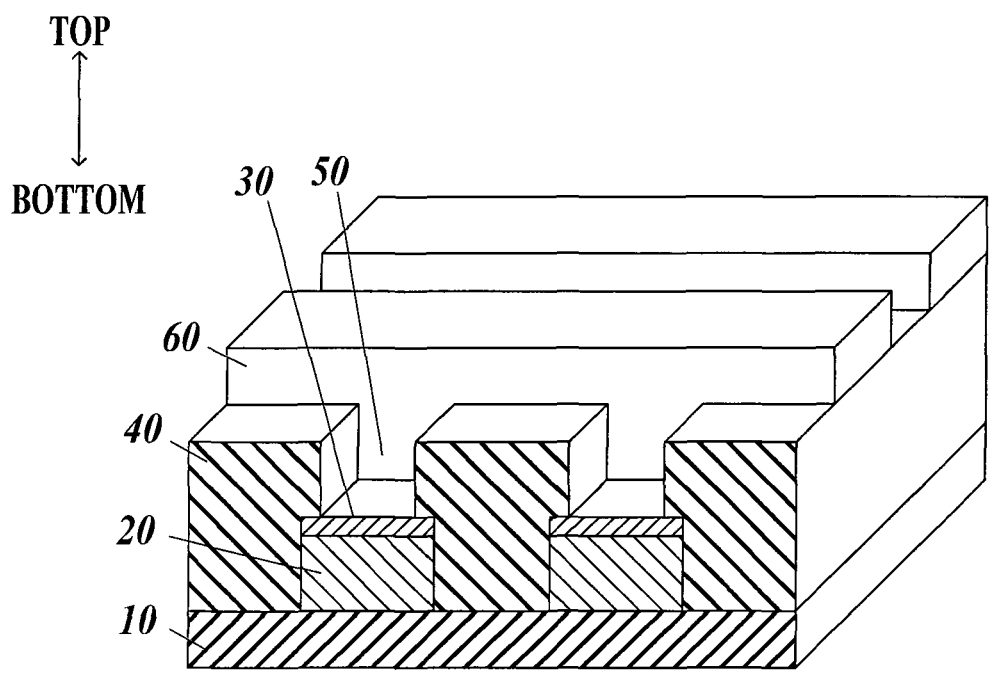
FIG. 7A is a front perspective cross sectional view explaining a second electrode forming step of the fabrication method of the present embodiment.
Figure 7B:
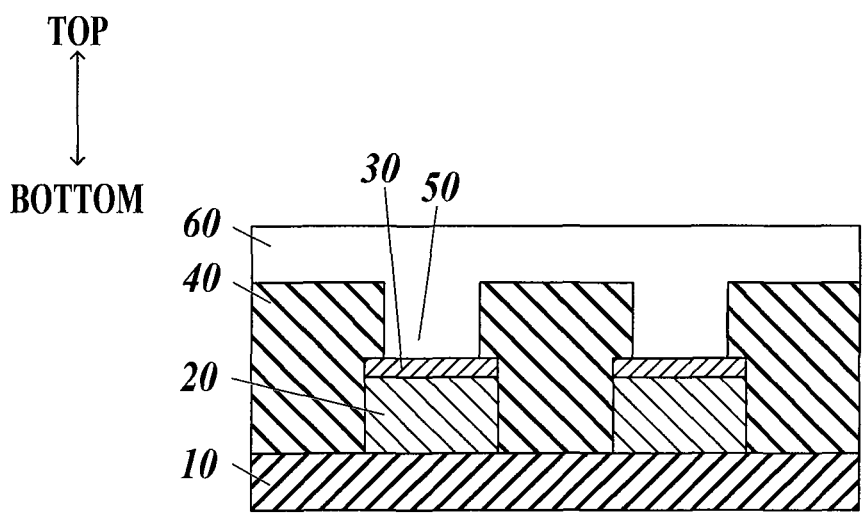
FIG. 7B is a front cross sectional view explaining a second electrode forming step of the fabrication method of the present embodiment.

For example, as shown in FIG. 7, the second electrode forming step is a step to form the second electrode 60 in contact with the upper surface of the spacer 30.

Specifically, for example, in the second electrode forming step, the second electrode 60 is formed so as to be in contact with at least a portion of the spacer 30 exposed by the depressed section 50 and a plurality of second electrodes 60 are formed parallel in a line at a predetermined interval so as to be substantially orthogonal to the line of the first electrodes 20.

More specifically, for example, by using a light exposure device, etc., a third resist pattern to form the second electrode 60 is formed on the upper surface of the insulating film 40 and the spacer 30. Next, the second electrode 60 is formed in a portion where the third resist pattern is not formed on the upper surface of the insulating film 40 and the upper surface of the spacer 30 by using a predetermined evaporation device. Next, the peeling liquid suitable for the material of the third resist pattern is used to remove only the third resist pattern.

[6] Spacer Removing Step (Step S6)

The spacer removing step is a step to form the gap 70 by removing the spacer 30.

Specifically, for example, the etching gas suitable for the material of the spacer 30 is used to selectively remove only the spacer 30.

Figure 8A:
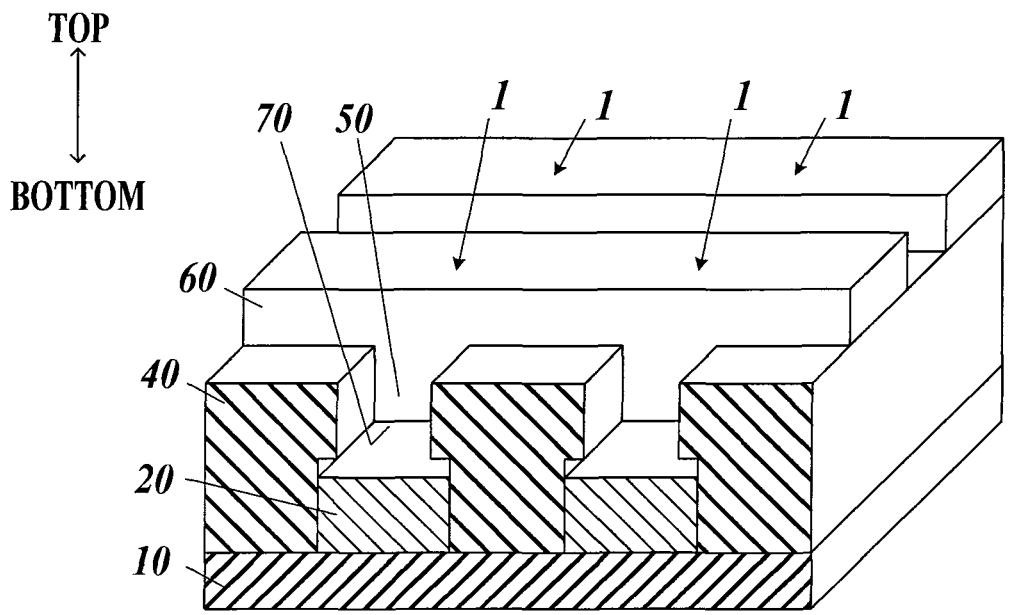
FIG. 8A is a front perspective cross sectional view explaining a spacer removing step of the fabrication method of the present embodiment.
Figure 8B:
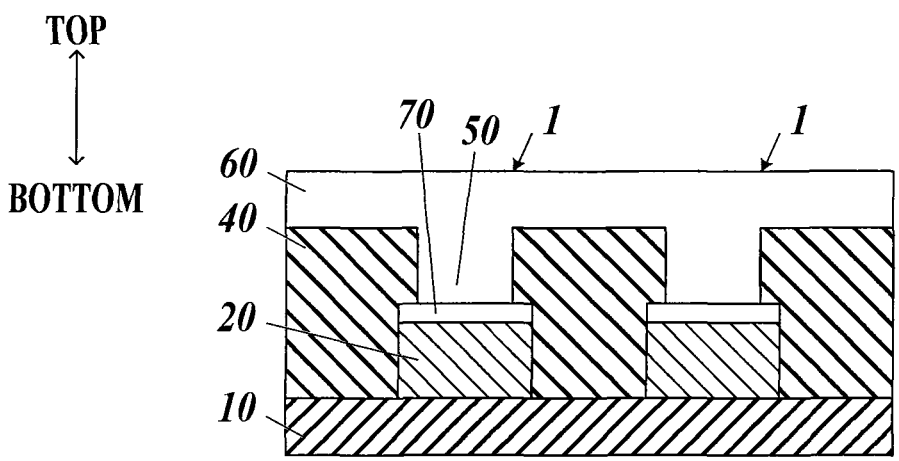
FIG. 8B is a front cross sectional view explaining a spacer removing step of the fabrication method of the present embodiment.

With this, for example, a nanogap element 1 as shown in FIG. 8 is fabricated.

The etching gas suitable for the material of the spacer 30 is not limited if the etching gas etches the spacer 30 but does not etch each section (insulating substrate 10, first electrode 20, insulating film 40 and second electrode 60) composing the nanogap element 1. Specifically, for example, when the first electrode 20 and the second electrode 60 are formed from metal, the insulating substrate 10 and the insulating film 40 include silicon oxide (SiO$_2$) and the spacer 30 includes silicon nitride (for example SiN), as etching gas suitable for the material of the spacer 30, mixed gas including CF$_4$ gas, O$_2$ gas and N$_2$ gas can be preferably used. Also, for example, when the first electrode 20 and the second electrode 60 are formed from metal, the insulating substrate 10 and the insulating film 40 include silicon oxide (SiO$_2$) and the spacer 30 includes alumina (Al$_2$O$_3$), as etching gas suitable for the material of the spacer 30, gas of the Cl system can be preferably used.

The fabrication method of the nanogap element 1 as described above is one example and the method is not limited to the above.

In the depressed section forming step (step S4), the depressed section 50 is formed on the insulating film 40 so as to expose a portion of the upper surface of the spacer 30. Alternatively, as long as the upper surface of the spacer 30 is exposed by the depressed section 50, for example, substantially the entire upper surface of the spacer 30 can be exposed by the depressed section 50. In this case, by narrowing the width of the first electrode 20 instead of expanding the width of the depressed section 50, the nanogap element 1 can be positioned at a high density when positioned in, for example, an array.

Also, in the spacer removing step (step S6), the spacer 30 is removed by dry etching (in other words, by using an etching gas suitable for the material of the spacer 30). Alternatively, if only the spacer 30 can be selectively removed, for example, the spacer 30 can be removed by wet etching (in other words, by using an etching liquid suitable for the material of the spacer 30).

Also, in the spacer removing step (step S6), the whole spacer 30 is removed. Alternatively, if the gap 70 can be formed, removing only a portion of the spacer 30 may be enough.

Also, for example, a step to form a sealing section (sealing section forming step) to block air from the gap 70 while maintaining the gap 70 can be performed after the spacer removing step (step S6).

More specifically, for example, by using PECVD, etc., an insulating body can be formed so as to cover the upper surface of the second electrode 60, the upper surface of the insulating film 40 and the opening section of the depressed section 50 to form a sealing section and air can be blocked from the gap 70. The sealing section is not limited to a component which covers the opening section of the depressed section 50 and can be any component which can at least block air from the gap 70 while maintaining the gap 70, for example a member which covers the entire nanogap element 1.

By providing a sealing section, the nanogap element 1 can be used in any desired atmosphere (for example, in the air). Also, the nanogap element 1 (gap 70) can be positioned in a desired atmosphere and by forming a sealing section in this state, the gap 70 can be maintained in a state positioned in the desired atmosphere.

According to the fabrication method of the nanogap element 1 of the present embodiment described above, the fabrication method includes, a first electrode forming step to form the first electrode 20, a spacer forming step to form the spacer 30 on the upper surface of the first electrode 20, a second electrode forming step to form the second electrode 60 in contact with the upper surface of the spacer 30 and a spacer removing step to form the gap 70 by removing the spacer 30.

In other words, the thickness of the spacer 30 is the distance between the nanogap electrodes (size of gap 70 provided between the first electrode 20 and the second electrode 60). Therefore, there is no influence of fabrication variation and the gap 70 with a desired size can be formed with high reproducibility.

Consequently, the nanogap element 1 with a certain distance between the nanogap electrodes can be easily mass produced.

Also, according to the fabrication method of the nanogap element 1 described above, the fabrication method includes an insulating film forming step to form an insulating film 40 to cover the spacer 30 and the first electrode 20 including the spacer 30 on its upper surface, and a depressed section forming step to form the depressed section 50 on the insulating film 40 to expose the upper surface of the spacer 30, and in the second electrode forming step, the second electrode 60 is formed so as to be in contact with the upper surface of the spacer 30 exposed by the depressed section 50.

In other words, after the first electrode forming step and the spacer forming step is performed, the insulating film 40 to support the second electrode 60 is formed (insulating film forming step) and the depressed section 50 is formed on the insulating film 40 (depressed section forming step). Then, the second electrode 60 in contact with the portion of the spacer 30 exposed by the depressed section 50 is formed (second electrode forming step) and the spacer removing step is performed. By simply performing such easy steps, mass production of nanogap elements 1 with a certain distance between the nanogap electrodes is possible without difficulty.

Also, according to the fabrication method of the nanogap element 1 of the present embodiment described above, in the first electrode forming step, the first electrode 20 is formed parallel in a line with a predetermined interval on the upper surface of the insulating substrate 10, in the depressed section forming step, the depressed section 50 is formed parallel in a line along the first electrode 20 in a line, and in the second electrode forming step, the second electrode 60 is formed parallel in a line with a predetermined interval so as to be substantially orthogonal with the first electrode 20 in a line.

In other words, the upper surface of the spacer 30 simultaneously includes a portion in contact with the second electrode 60 and a portion not in contact with the second electrode 60.

Therefore, when the spacer 30 is removed using an etching gas (etching liquid, etc. can also be used) suitable for the material of the spacer 30, first the portion of the spacer 30 not in contact with the second electrode 60 is removed and then the portion of the spacer 30 in contact with the second electrode 60 is removed. Since the portion of the spacer 30 in contact with the second electrode 60 is sandwiched by the portions not in contact with the second electrode 60 and the etching gas can easily come into contact, the spacer 30 can be efficiently removed.

Also, according to the above described fabrication method of the nanogap element 1 of the present embodiment, the insulating film 40 includes silicon oxide ($SiO_2$) and the spacer 30 includes silicon nitride (for example, SiN) and in the spacer removing step, the spacer 30 is removed by using mixed gas including $CF_4$ gas, $O_2$ gas and $N_2$ gas.

Therefore, only the spacer 30 can be removed with high selectivity.

The present invention is not limited to the above described embodiment and can be suitably modified without leaving the scope of the invention.

<Modification 1>

In the spacer forming step (step S2) of the above described embodiment, PECVD, etc. is used to form the spacer 30 on the first electrode 20. Alternatively, if the spacer 30 can be formed on the upper surface of the first electrode 20, for example, the spacer 30 can be formed by performing a predetermined surface processing on the upper surface of the first electrode 20.

In the spacer removing step (step S6), the predetermined surface processing is not limited as long as the portion of the first electrode 20 on which the surface processing is not performed is not removed, and only the portion (spacer 30) on which the surface processing is performed can be selectively removed. Specifically, for example, when the first electrode 20 includes copper, by performing oxidation treatment on the upper surface of the first electrode 20, the upper surface becomes copper oxide (CuO or $Cu_2O$) and the copper oxide is to be the spacer 30. In this case, dilute sulfuric acid can be preferably used as the etching liquid suitable for the material of the spacer 30.

<Modification 2>

Figure 9A:
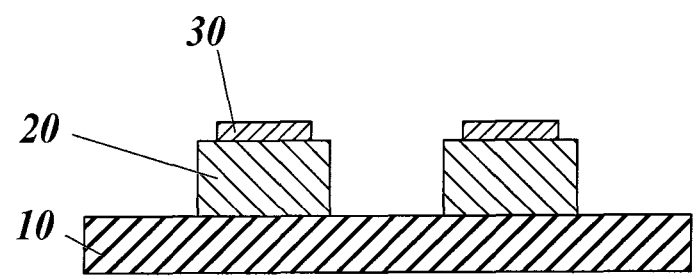
FIG. 9A is a diagram explaining the spacer forming step of a fabrication method of modification 2.

In the spacer forming step (step S2) of the above described embodiment, the spacer 30 is formed on substantially the entire upper surface of the first electrode 20. Alternatively, if the spacer 30 is formed on the upper surface of the first electrode 20, for example, as shown in FIG. 9A, the spacer 30 can be formed on a portion of the upper surface of the first electrode 20.

Figure 9B:
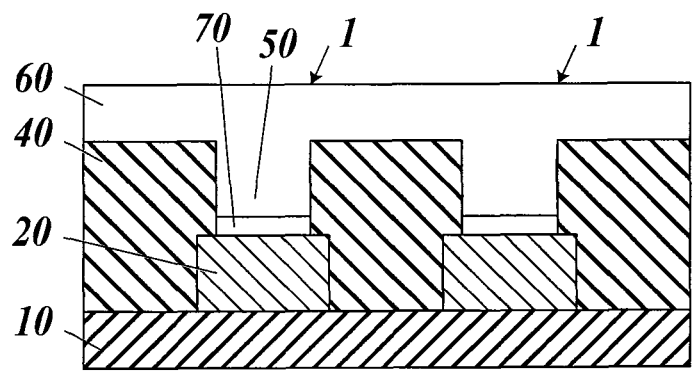
FIG. 9B is a diagram showing the element including the nanogap electrodes fabricated by the fabrication method of modification 2.

In this case, since the insulating film 40 is formed on the portion of the upper surface of the first electrode 20 where the spacer 30 is not formed, for example, a nanogap element 1 as shown in FIG. 9B is formed with a portion (portion where the spacer 30 is not formed) of the upper surface of the first electrode 20 in contact with the insulating film 40.

<Modification 3>

Figure 10A:
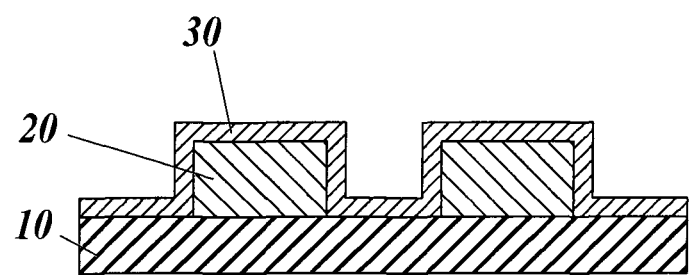
FIG. 10A is a diagram explaining the spacer forming step of a fabrication method of modification 3.

In the spacer forming step (step S2) of the above described embodiment, the spacer 30 is formed on only the upper surface of the first electrode 20. Alternatively, if the spacer 30 is formed on the upper surface of the first electrode 20, for example, as shown in FIG. 10A, the spacer 30 can be formed so as to cover the first electrode 20.

Figure 10B:
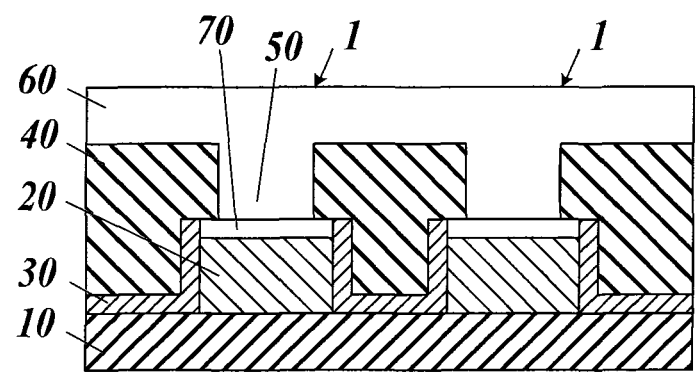
FIG. 10B is a diagram showing the element including the nanogap electrodes fabricated by the fabrication method of modification 3.

In this case, the spacer 30 needs to support the insulating film 40 in order to maintain a state where the gap 70 is formed. Therefore, for example, as shown in FIG. 10B, a nanogap element 1 is fabricated with the spacer 30 remaining at least between the side face of the first electrode 20 and the insulating film 40 and between the insulating substrate 10 and the insulating film 40.

<Modification 4>

Figure 11:
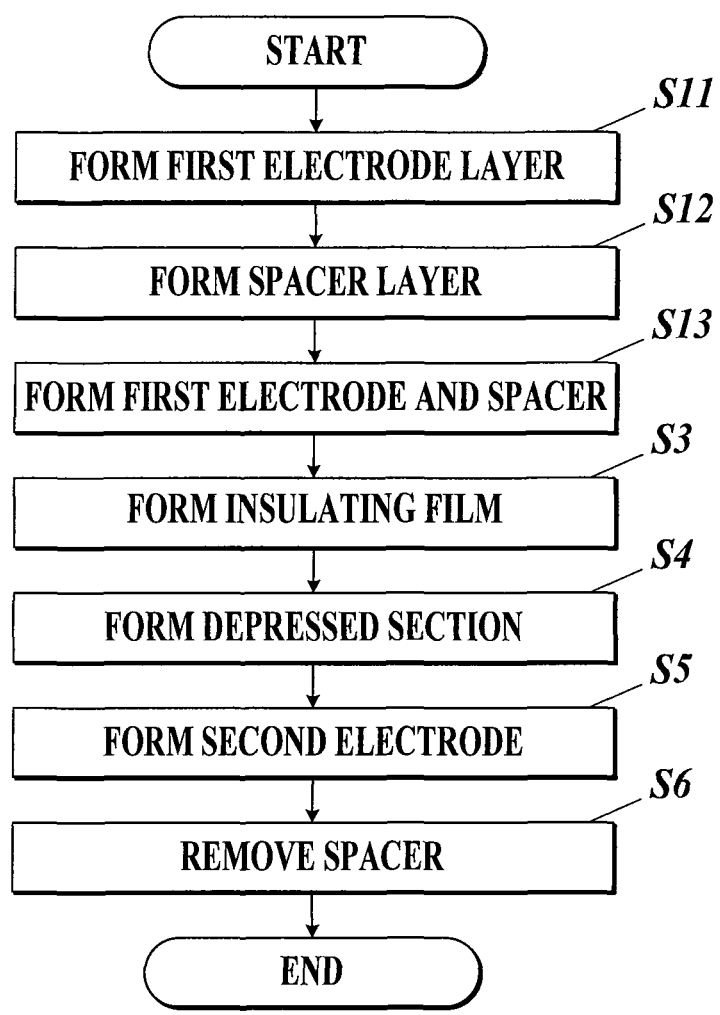
FIG. 11 is a flowchart explaining a fabrication method of modification 4.

The fabrication method of the nanogap element 1 is not limited to the above described embodiment and for example, as shown in FIG. 11, the fabrication method can include [1] first electrode layer forming step (step S11), [2] spacer layer forming step (step S12), [3] first electrode and spacer forming step (step S13), [4] insulating film forming step (step S3), [5] depressed section forming step (step S4), [6] second electrode forming step (step S5), and [7] spacer removing step (step S6).

[1] First Electrode Layer Forming Step (Step S11)

Figure 12A:
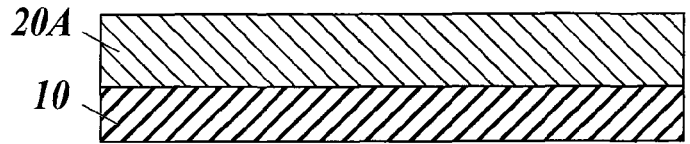
FIG. 12A is a diagram explaining a first electrode layer forming step of the fabrication method of modification 4.

For example, as shown in FIG. 12A, the first electrode layer forming step is a step to form a first electrode layer 20A which is to be a first electrode 20.

Specifically, for example the first electrode layer 20A is formed on substantially the entire upper surface of the insulating substrate 10 by using a predetermined evaporation device.

[2] Spacer Layer Forming Step (Step S12)

Figure 12B:
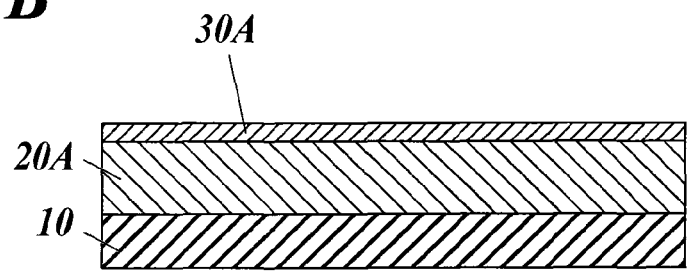
FIG. 12B is a diagram explaining a spacer layer forming step of the fabrication method of modification 4.

For example, as shown in FIG. 12B, the spacer layer forming step is a step to form the spacer layer 30A, which is to be the spacer 30, on the upper surface of the first electrode layer 20A.

Specifically, for example, the spacer layer 30A is formed on substantially the entire upper surface of the first electrode layer 20A by using PECVD, etc.

The spacer layer forming step (step S12) is not limited to forming the spacer layer 30A on the first electrode layer 20A using PECVD, etc., and the spacer layer 30A can be formed by performing predetermined surface processing on the upper surface of the first electrode layer 20A.

[3] First Electrode and Spacer Forming Step (Step S13)

Figure 12C:
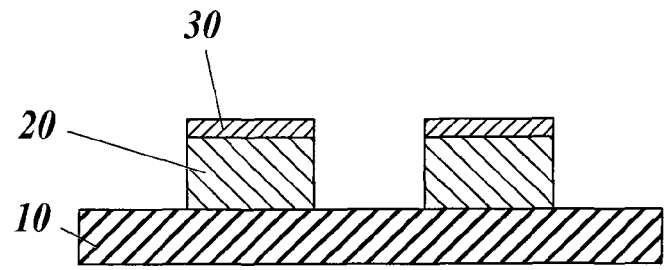
FIG. 12C is a diagram explaining a first electrode and spacer forming step of the fabrication method of modification 4.

For example, as shown in FIG. 12C, the first electrode and spacer forming step is a step to form the spacer 30 and the first electrode 20 included on the upper surface of the spacer 30 from the first electrode layer 20A and the spacer layer 30A.

Specifically, for example, a resist pattern to form the first electrode 20 and the spacer 30 is formed on the upper surface of the spacer layer 30A by using a light exposure device, etc. Next, only the portion on which the resist pattern is not formed on the spacer layer 30A is selectively removed using the etching gas suitable for the material of the spacer layer 30A and the spacer 30 is formed. Next, only the portion where the upper surface is exposed on the first electrode layer 20A is selectively removed using the etching gas suitable for the material of the first electrode layer 20A and the first electrode 20 including the spacer 30 on it upper surface is formed. Next, the peeling liquid suitable for the material of the resist pattern is used to remove only the resist pattern.

[4] Insulating Film Forming Step (Step S3)

The insulating film forming step is a step to form an insulating film 40 on substantially the entire upper surface of the insulating substrate 10 to cover the spacer 30 and the first electrode 20 including the spacer 30 on its upper surface.

[5] Depressed Section Forming Step (Step S4)

The depressed section forming step is a step to form the depressed section 50 on the insulating film 40 to expose a portion of the upper surface of the spacer 30.

[6] Second Electrode Forming Step (Step S5)

The second electrode forming step is a step to form the second electrode 60 in contact with the upper surface of the spacer 30.

[7] Spacer Removing Step (Step S6)

The spacer removing step is a step to form the gap 70 by removing the spacer 30.

Figure 12D:
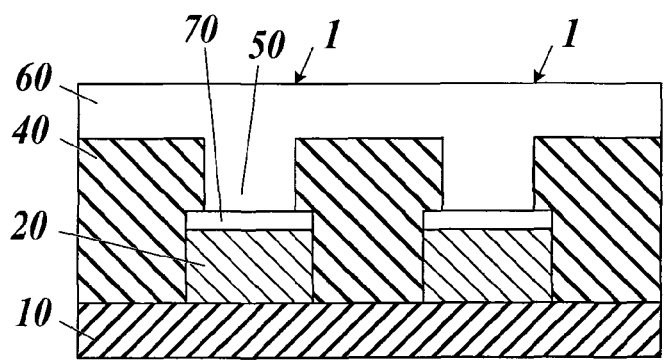
FIG. 12D is a diagram showing an element including nanogap electrodes fabricated by the fabrication method of modification 4.

With this, for example, the nanogap element 1 as shown in FIG. 12D is fabricated.

<Modification 5>

Figure 13:
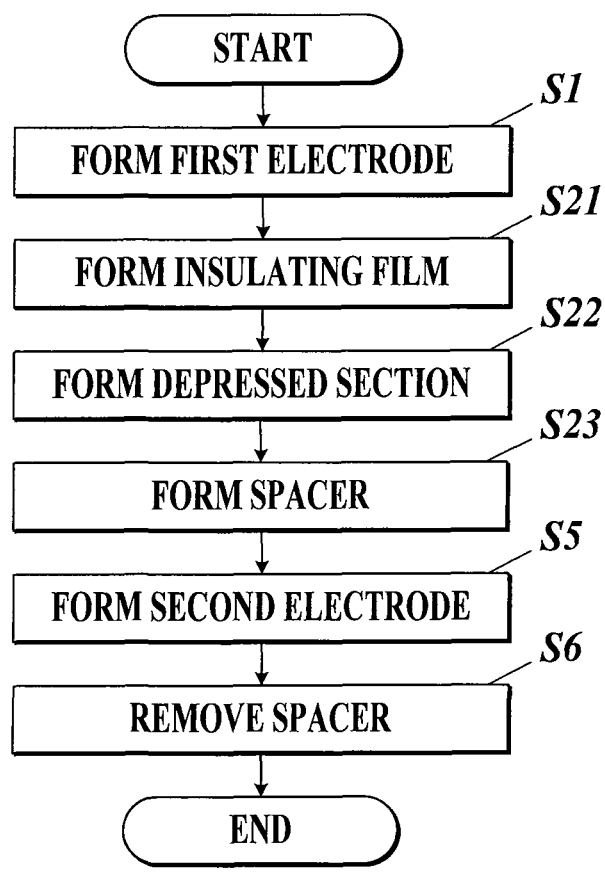
FIG. 13 is a flowchart explaining a fabrication method of modification 5.

The fabrication method of the nanogap element 1 is not limited to the above described embodiment, and for example, as shown in FIG. 13, the modification method can include [1] first electrode forming step (step S1), [2] insulating film forming step (step S21), [3] depressed section forming step (step S22), [4] spacer forming step (step S23), [5] second electrode forming step (step S5), and [6] spacer removing step (step S6).

[1] First Electrode Forming Step (Step S1)

The first electrode forming step is a step to form the first electrode 20 on the upper surface of the insulating substrate 10.

[2] Insulating Film Forming Step (Step S21)

Figure 14A:
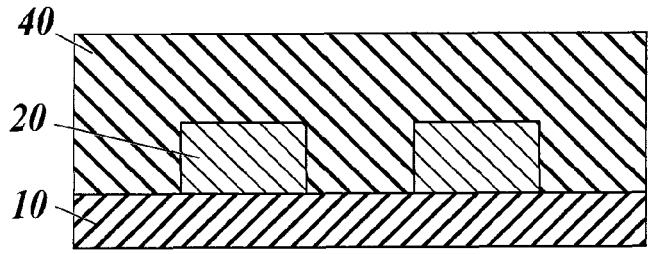
FIG. 14A is a diagram explaining an insulating film forming step of the fabrication method of modification 5.

For example, as shown in FIG. 14A, the insulating film forming step is a step to form the insulating film 40 to cover the first electrode 20 on substantially the entire upper surface of the insulating substrate 10.

[3] Depressed Section Forming Step (Step S22)

Figure 14B:
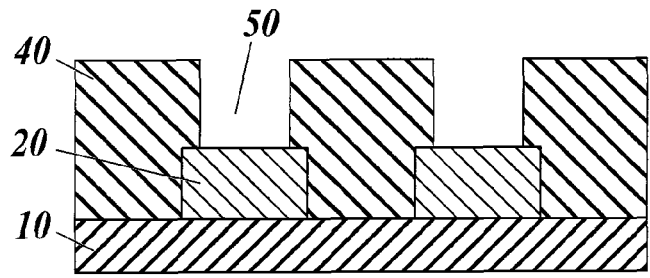
FIG. 14B is a diagram explaining a depressed section forming step of the fabrication method of modification 5.

For example, as shown in FIG. 14B, the depressed section forming step is a step to form the depressed section 50 on the insulating film 40 to expose a portion of the upper surface of the first electrode 20.

The depressed section forming step (step S22) is not limited to forming the depressed section 50 on the insulating film 40 to expose a portion of the upper surface of the first electrode 20 and the depressed section 50 can be formed on the insulating film 40 to expose substantially the entire upper surface of the first electrode 20.

[4] Spacer Forming Step (Step S23)

Figure 14C:
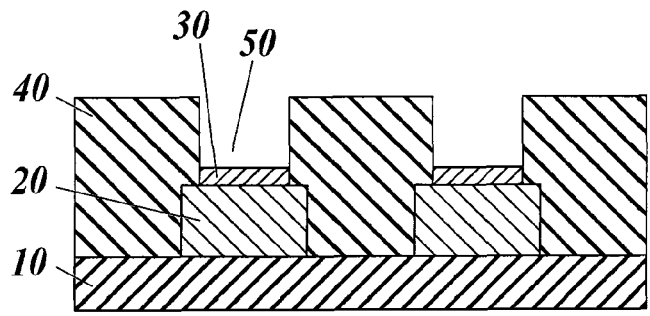
FIG. 14C is a diagram explaining a spacer forming step of the fabrication method of modification 5.

For example, as shown in FIG. 14C, the spacer forming step is a step to form the spacer 30 on the upper surface of the first electrode 20 exposed by the depressed section 50.

The spacer forming step (step S23) is not limited to forming the spacer 30 on the first electrode 20 using the PECVD, etc., and the spacer 30 can be formed by performing predetermined surface processing on the upper surface of the first electrode 20.

[5] Second Electrode Forming Step (Step S5)

The second electrode forming step is a step to form the second electrode 60 in contact with the upper surface of the spacer 30.

[6] Spacer Removing Step (Step S6)

The spacer removing step is a step to form the gap 70 by removing the spacer 30.

Figure 14D:
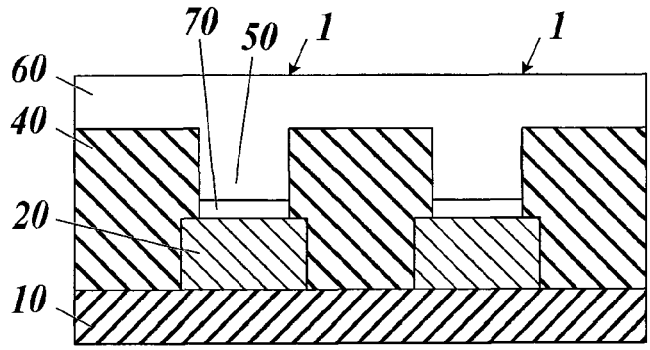
FIG. 14D is a diagram showing an element including nanogap electrodes fabricated by the fabrication method of the modification 5.

With this, for example, a nanogap element 1 as shown in FIG. 14D is fabricated.

<Modification 6>

Figure 15:
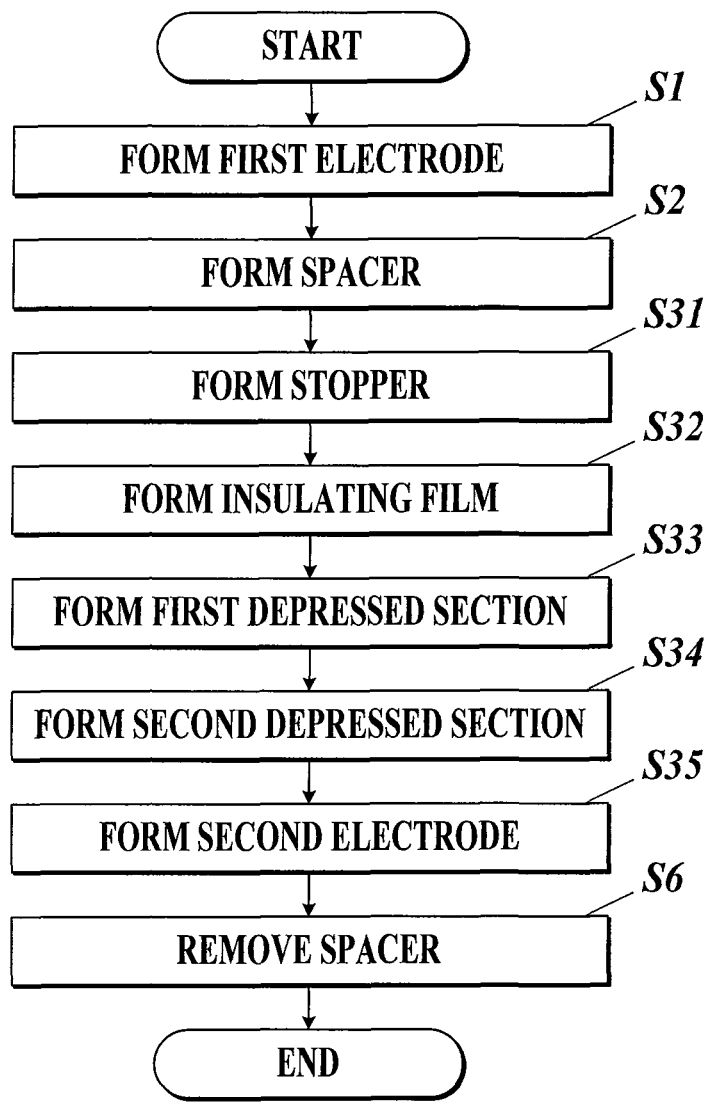
FIG. 15 is a flowchart explaining a fabrication method of modification 6.

The modification method of the nanogap element 1 is not limited to the above described embodiment and for example, as shown in FIG. 15, the modification method can include [1] first electrode forming step (step S1), [2] spacer forming step (step S2), [3] stopper forming step (step S31), [4] insulating film forming step (step S32), [5] first depressed section forming step (step S33), [6] second depressed section forming step (step S34), [7] second electrode forming step (step S35), and [8] spacer removing step (step S6).

[1] First Electrode Forming Step (Step S1)

The first electrode forming step is a step to form the first electrode 20 on the upper surface of the insulating substrate 10.

[2] Spacer Forming Step (Step S2)

The spacer forming step is a step to form the spacer 30 on the upper surface of the first electrode 20.

[3] Stopper Forming Step (Step S31)

Figure 16A:
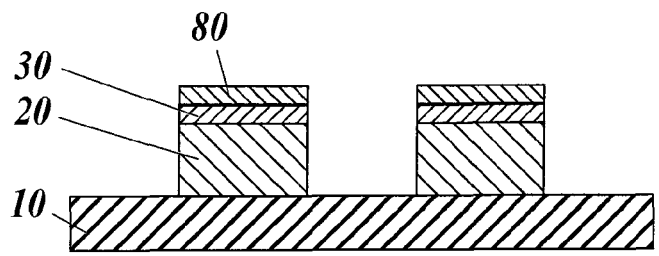
FIG. 16A is a diagram explaining a stopper forming step of the fabrication method of modification 6.

For example, as shown in FIG. 16A, the stopper forming step is a step to form a stopper 80 on the upper surface of the spacer 30.

In the stopper forming step (step S31), the stopper 80 can be formed on substantially the entire upper surface of the spacer 30 or the stopper 80 can be formed on a portion of the upper surface of the spacer 30.

[4] Insulating Film Forming Step (Step S32)

Figure 16B:
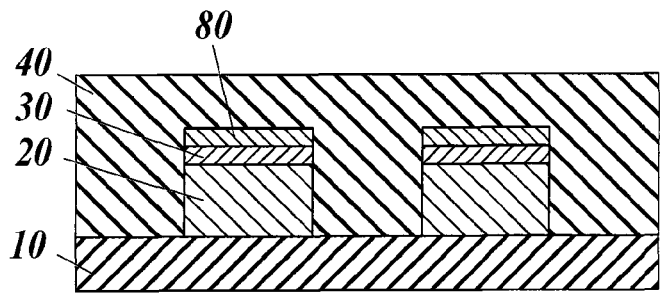
FIG. 16B is a diagram explaining an insulating film forming step of the fabrication method of modification 6.

For example, as shown in FIG. 16B, the insulating film forming step is a step to form an insulating film 40 on substantially the entire upper surface of the insulating substrate 10 to cover the stopper 80, the spacer 30 including the stopper 80 on its upper surface and the first electrode 20 including the spacer 30 on its upper surface.

[5] First Depressed Section Forming Step (Step S33)

Figure 16C:
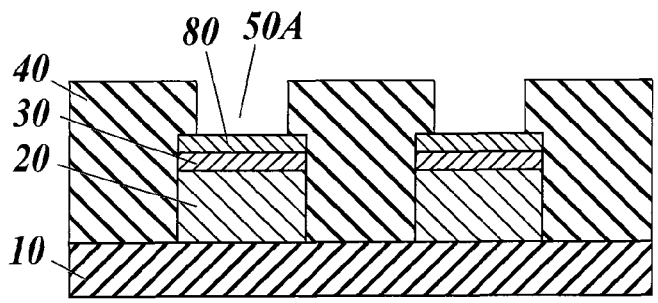
FIG. 16C is a diagram explaining a first depressed section forming step of the fabrication method of modification 6.

For example, as shown in FIG. 16C, the first depressed section forming step is a step to form the first depressed section 50A on the insulating film 40 to expose a portion of the upper surface of the stopper 80.

The first depressed section forming step (step S33) is not limited to forming the first depressed section 50A on the insulating film 40 to expose a portion of the upper surface of the stopper 80 and the first depressed section 50A can be formed on the insulating film 40 to expose substantially the entire upper surface of the stopper 80.

[6] Second Depressed Section Forming Step (Step S34)

Figure 16D:
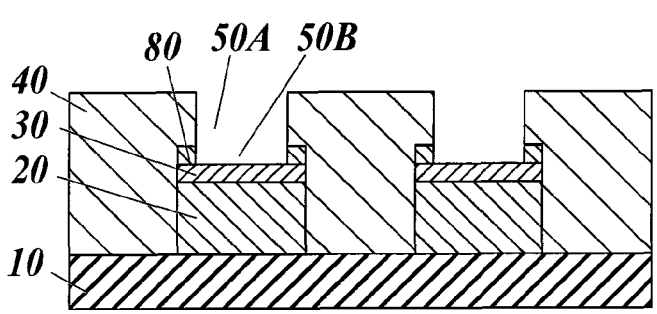
FIG. 16D is a diagram explaining a second depressed section forming step of the fabrication method of modification 6.

For example, as shown in FIG. 16D, the second depressed section forming step is a step to form the second depressed section 50B on the stopper 80 to expose a portion of the upper surface of the spacer 30.

The second depressed section forming step (step S34) is not limited to forming the second depressed section 50B on the stopper 80 to expose a portion of the upper surface of the spacer 30 and the second depressed section 50B can be formed on the stopper 80 to expose substantially the entire upper surface of the spacer 30.

More specifically, in the first depressed section forming step, the first depressed section 50A is formed using the etching gas suitable for the material of the insulating film 40, and in the second depressed section forming step, the second depressed section 50B is formed using the etching gas suitable for the material of the stopper 80.

The etching gas suitable for the material of the insulating film 40 is not limited if the gas etches the insulating film 40 but does not etch the stopper 80. Also, the etching gas suitable for the material of the stopper 80 is not limited if the gas etches the stopper 80 but does not etch the spacer 30. Specifically, for example, when the insulating film 40 includes $SiO_2$, the stopper 80 includes $Al_2O_3$, and the spacer 30 includes SiN, $C_4F_8$ gas can be preferably used as the etching gas suitable for the material of the insulating film 40 and $Cl_2$ gas can be preferably used as the etching gas suitable for the material of the stopper 80.

[7] Second Electrode Forming Step (Step S35)

The second electrode forming step is a step to form the second electrode 60 so as to be in contact with the upper surface of the spacer 30 exposed by the second depressed section 50B.

[8] Spacer Removing Step (Step S6)

The spacer removing step is a step to form the gap 70 by removing the spacer 30.

Figure 16E:
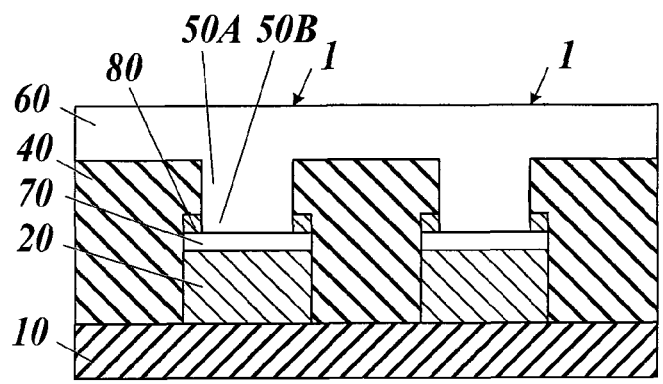
FIG. 16E is a diagram showing an element including nanogap electrodes fabricated by the fabrication method of modification 6.

With this, for example, the nanogap element 1 shown in FIG. 16E is fabricated.

<Modification 7>

Figure 17A:
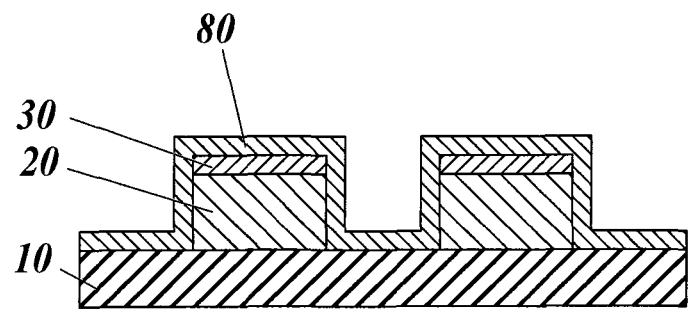
FIG. 17A is a diagram explaining a stopper forming step of a fabrication method of modification 7.

In the stopper forming step (step S31) of the above described modification 6, the stopper 80 is formed on substantially the entire upper surface of the spacer 30. Alternatively, if the stopper 80 is formed on the upper surface of the spacer 30, the stopper 80 can be formed on a portion of the upper surface of the spacer 30 or, for example, as shown in FIG. 17A, the stopper 80 can be formed so as to cover the spacer 30 and the first electrode 20 including the spacer 30 on its upper surface.

Figure 17B:
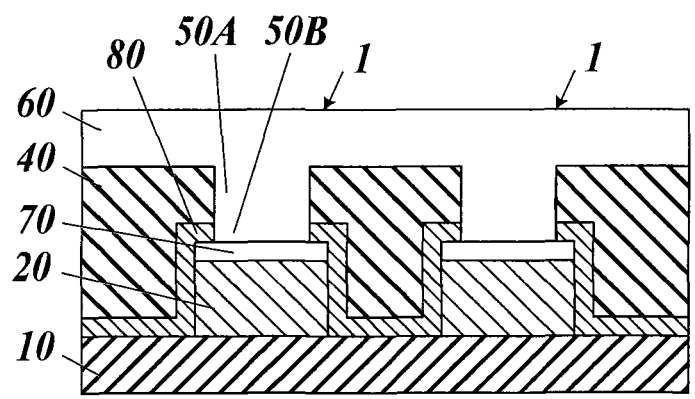
FIG. 17B is a diagram showing an element including nanogap electrodes fabricated by the fabrication method of modification 7.

When the stopper 80 is formed so as to cover the spacer 30 and the first electrode 20 including the spacer 30 on its upper surface, for example, the nanogap element 1 as shown in FIG. 17B is fabricated.

<Modification 8>

Figure 18A:
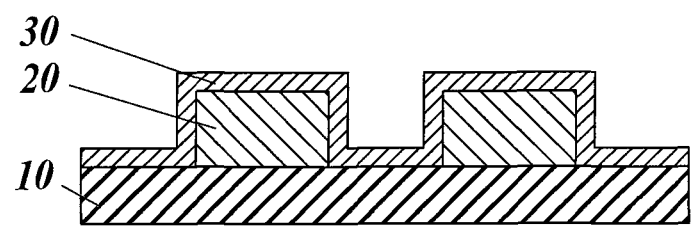
FIG. 18A is a diagram explaining a spacer forming step of the fabrication method of modification 8.

Also, in the spacer forming step (step S2) of the above described modification 6, the spacer 30 is formed on substantially the entire upper surface of the first electrode 20. Alternatively, if the spacer 30 is formed on the upper surface of the first electrode 20, the spacer 30 can be formed on a portion of the upper surface of the first electrode 20 or, for example, as shown in FIG. 18A, the spacer 30 can be formed so as to cover the first electrode 20.

Figure 18B:
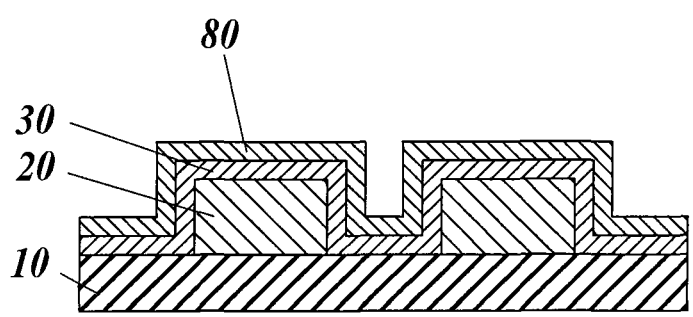
FIG. 18B is a diagram explaining a stopper forming step of the fabrication method of modification 8.
Figure 18C:
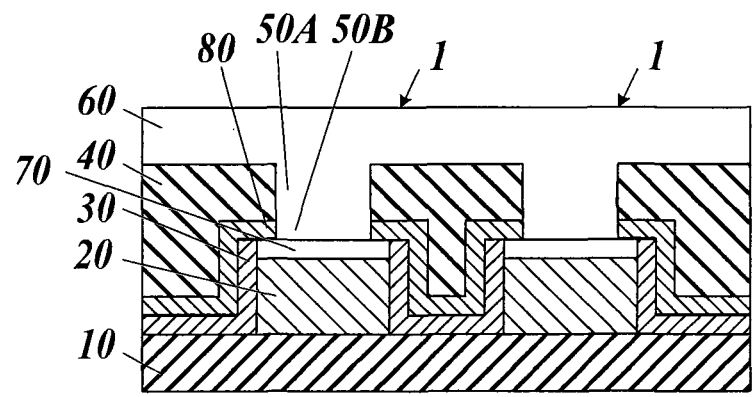
FIG. 18C is a diagram showing an element including nanogap electrodes fabricated by the fabrication method of modification 8.

When the spacer 30 is formed so as to cover the first electrode 20, for example, as shown in FIG. 18B, the stopper 80 can be formed so as to cover the spacer 30. With this, for example, the nanogap element 1 as shown in FIG. 18C is fabricated.

<Modification 9>

Figure 19:
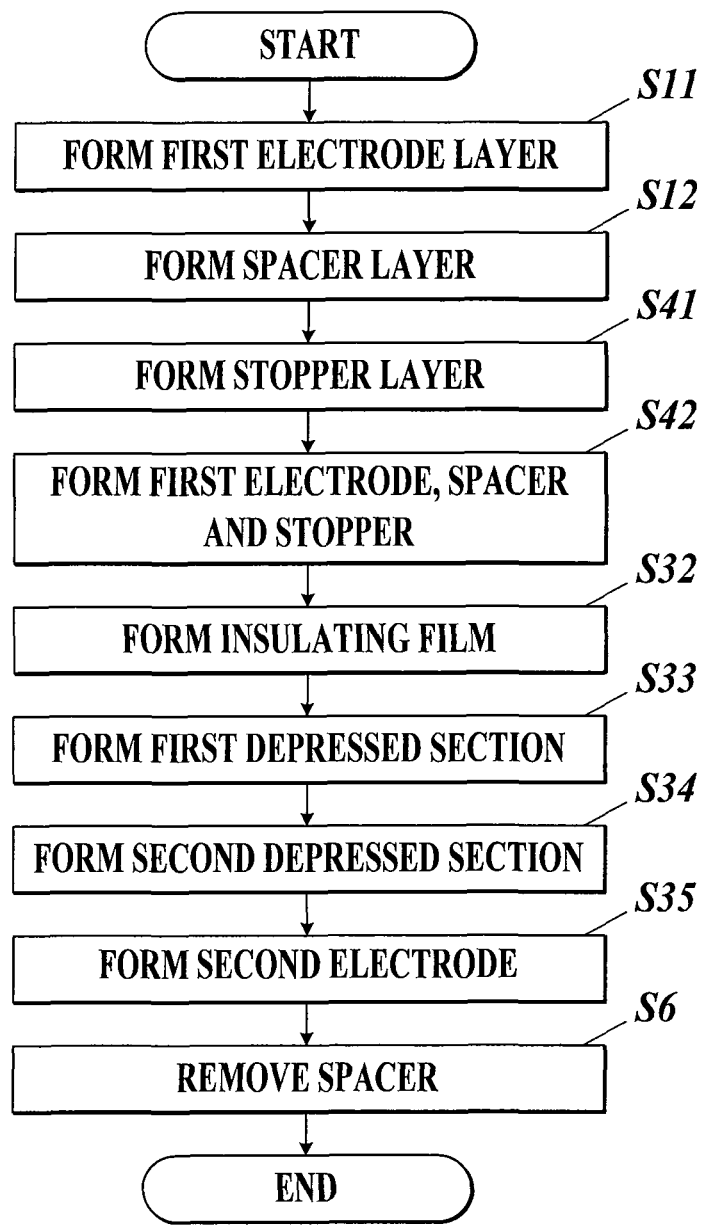
FIG. 19 is a flowchart explaining a fabrication method of modification 9.

The fabrication method of the nanogap element 1 is not limited to the above described embodiment and for example, as shown in FIG. 19, the fabrication method can include the following steps of [1] first electrode layer forming step (step S11), [2] spacer layer forming step (step S12), [3] stopper layer forming step (step S41), [4] first electrode, spacer and stopper forming step (step S42), [5] insulating film forming step (step S32), [6] first depressed section forming step (step S33), [7] second depressed section forming step (step S34), [8] second electrode forming step (step S35), and [9] spacer removing step (step S6).

[1] First Electrode Layer Forming Step (Step S11)

The first electrode layer forming step is a step to form the first electrode layer 20A, which is to be the first electrode 20, on substantially the entire upper surface of the insulating substrate 10.

[2] Spacer Layer Forming Step (Step S12)

For example, the spacer layer forming step is a step to form a spacer layer 30A, which is to be the spacer 30, on the upper surface of the first electrode layer 20A.

[3] Stopper Layer Forming Step (Step S41)

Figure 20A:
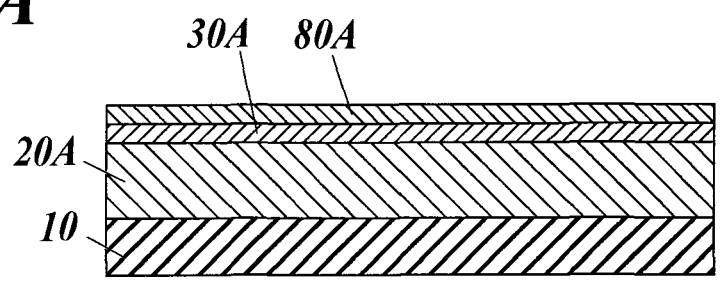
FIG. 20A is a diagram explaining a stopper layer forming step of the fabrication method of modification 9.

For example, as shown in FIG. 20A, the stopper layer forming step is a step to form the stopper layer 80A, which is to be the stopper 80, on the upper surface of the spacer layer 30A.

[4] First Electrode, Spacer and Stopper Forming Step (Step S42)

Figure 20B:
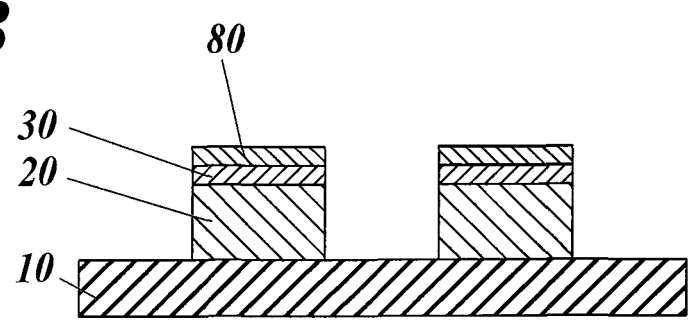
FIG. 20B is a diagram explaining a first electrode, spacer and stopper forming step of the fabrication method of modification 9.

For example, as shown in FIG. 20B, the first electrode, spacer and stopper forming step is a step to form the stopper 80, the spacer 30 including the stopper 80 on its upper surface and the first electrode 20 including the spacer 30 on its upper surface from the first electrode layer 20A, spacer layer 30A and stopper layer 80A.

[5] Insulating Layer Forming Step (Step S32)

The insulating film forming step is a step to form the insulating film 40 on substantially the entire upper surface of the insulating substrate 10 to cover the stopper 80, the spacer 30 including the stopper 80 on its upper surface and the first electrode 20 including the spacer 30 on its upper surface.

[6] First Depressed Section Forming Step (Step S33)

The first depressed section forming step is a step to form the first depressed section 50A on the insulating film 40 to expose a portion of the upper surface of the stopper 80.

[7] Second Depressed Section Forming Step (Step S34)

The second depressed section forming step is a step to form the second depressed section 50B on the stopper 80 to expose a portion of the upper surface of the spacer 30.

[8] Second Electrode Forming Step (Step S35)

The second electrode forming step is a step to form the second electrode 60 so as to be in contact with the upper surface of the spacer 30 exposed by the second depressed section 50B.

[9] Spacer Removing Step (Step S6)

The spacer removing step is a step to form the gap 70 by removing the spacer 30.

Figure 20C:
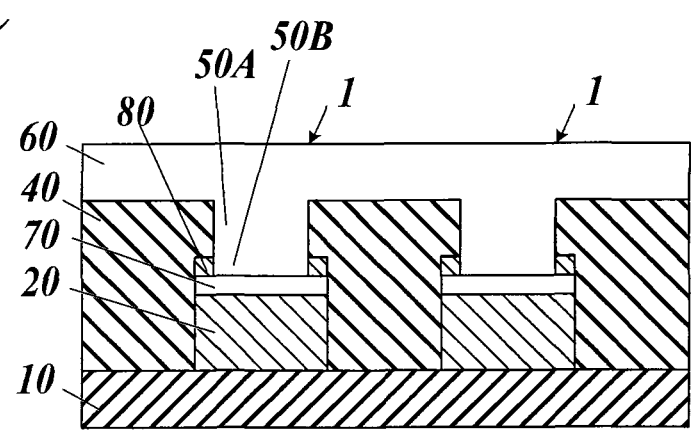
FIG. 20C is a diagram showing an element including nanogap electrodes fabricated by the fabrication method of modification 9.

With this, for example, the nanogap element 1 as shown in FIG. 20C is fabricated.

<Modification 10>

Figure 21:
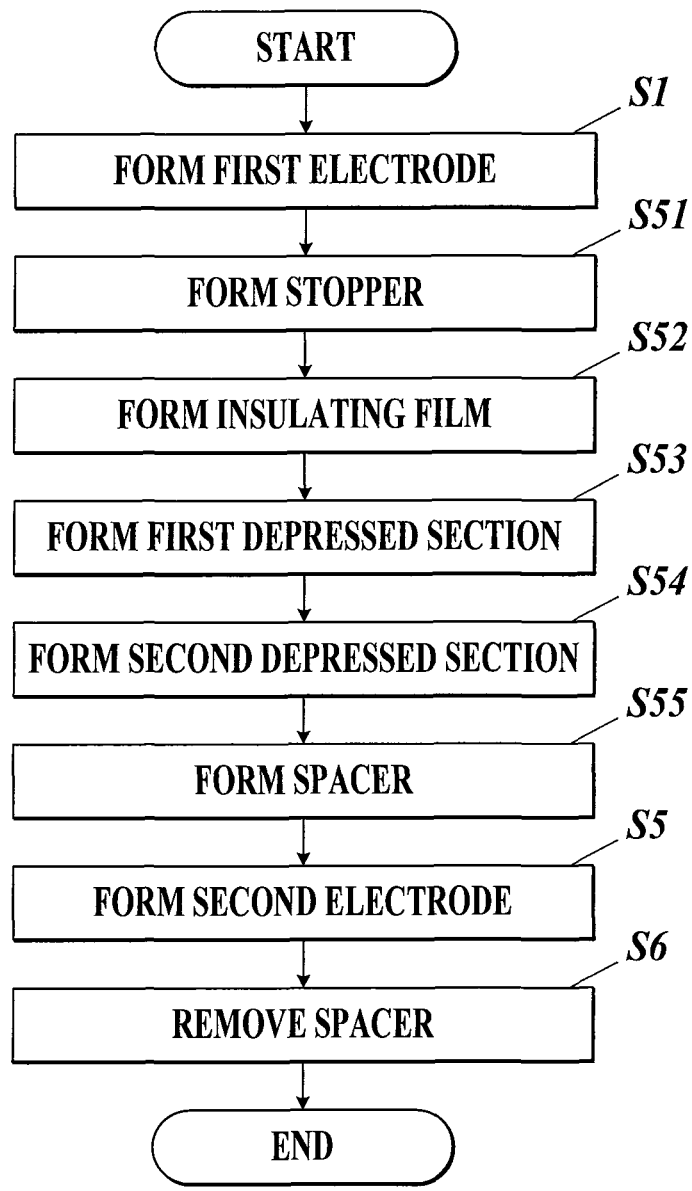
FIG. 21 is a flowchart explaining a fabrication method of modification 10.

The fabrication method of the nanogap element 1 is not limited to the above described embodiment, and for example, as shown in FIG. 21, the fabrication method can include the following steps of, [1] first electrode forming step (step S1), [2] stopper forming step (step S51), [3] insulating film forming step (step S52), [4] first depressed section forming step (step S53), [5] second depressed section forming step (step S54), [6] spacer forming step (step S55), [7] second electrode forming step (step S5), and [8] spacer removing step (step S6).

[1] First Electrode Forming Step (Step S1)

The first electrode forming step is a step to form the first electrode 20 on the upper surface of the insulating substrate 10.

[2] Stopper Forming Step (Step S51)

Figure 22A:
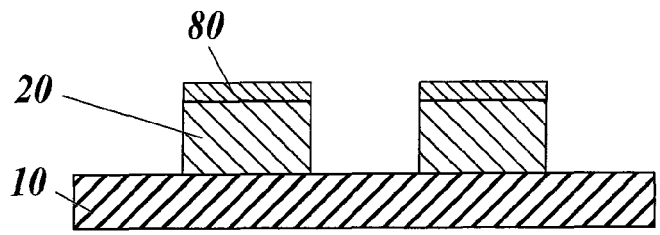
FIG. 22A is a diagram explaining a stopper forming step of the fabrication method of modification 10.

For example, as shown in FIG. 22A, the stopper forming step is a step to form the stopper 80 on the upper surface of the first electrode 20.

[3] Insulating Film Forming Step (Step S52)

Figure 22B:
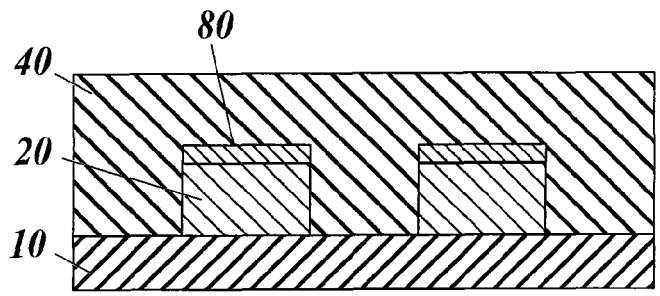
FIG. 22B is a diagram explaining an insulating film forming step of the fabrication method of modification 10.

For example, as shown in FIG. 22B, the insulating film forming step is a step to form the insulating film 40 on substantially the entire upper surface of the insulating substrate 10 to cover the stopper 80 and the first electrode 20 including the stopper 80 on its upper surface.

[4] First Depressed Section Forming Step (Step S53)

The first depressed section forming step is a step to form the first depressed section 50A on the insulating film 40 to expose a portion of the upper surface of the stopper 80.

The first depressed section forming step (Step S53) is not limited to forming the first depressed section 50A on the insulating film 40 to expose a portion of the upper surface of the stopper 80 and the first depressed section 50A can be formed on the insulating film 40 to expose substantially the entire upper surface of the stopper 80.

[5] Second Depressed Section Forming Step (Step S54)

Figure 22C:
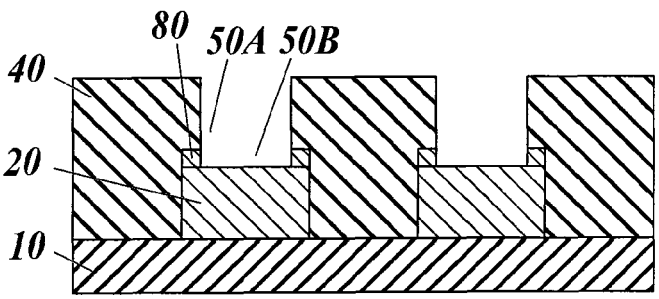
FIG. 22C is a diagram explaining a second depressed section forming step of the fabrication method of modification 10.

For example, as shown in FIG. 22C, the second depressed section forming step is a step to form the second depressed section 50B on the stopper 80 to expose a portion of the upper surface of the first electrode 20.

The second depressed section forming step (step S54) is not limited to forming the second depressed section 50B on the stopper 80 to expose a portion of the upper surface of the first electrode 20 and the second depressed section 50B can be formed on the stopper 80 to expose substantially the entire upper surface of the first electrode 20.

[6] Spacer Forming Step (Step S55)

Figure 22D:
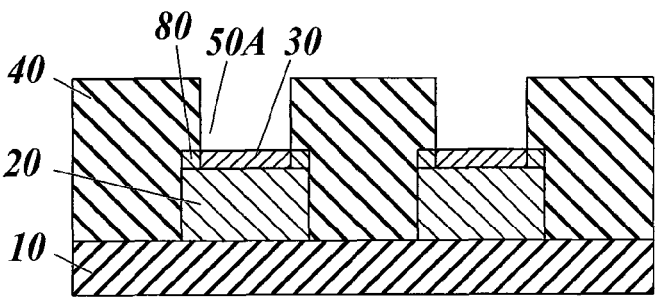
FIG. 22D is a diagram explaining a spacer forming step of the fabrication method of modification 10.

For example, as shown in FIG. 22D, the spacer forming step is a step to form the spacer 30 on the upper surface of the first electrode 20 exposed by the second depressed section 50B.

[7] Second Electrode Forming Step (Step S5)

The second electrode forming step is a step to form the second electrode 60 in contact with the upper surface of the spacer 30.

[8] Spacer Removing Step (Step S6)

The spacer removing step is a step to form the gap 70 by removing the spacer 30.

Figure 22E:
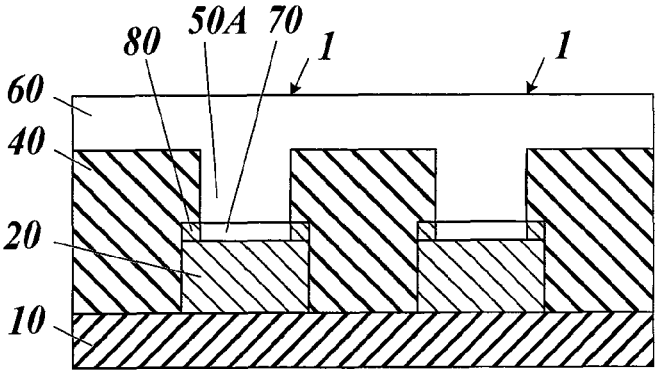
FIG. 22E is a diagram showing an element including nanogap electrodes fabricated by the fabrication method of modification 10.

With this, for example, the nanogap element 1 as shown in FIG. 22E is fabricated.

<Modification 11>

Figure 23A:
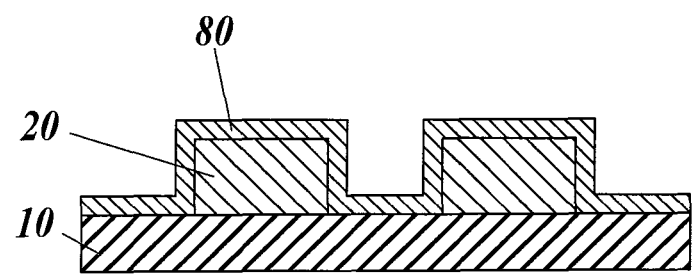
FIG. 23A is a diagram explaining a stopper forming step of the fabrication method of modification 11.

In the stopper forming step (step S51) of the above described modification 10, the stopper 80 is formed on substantially the entire upper surface of the first electrode 20. Alternatively, if the stopper 80 is formed on the upper surface of the first electrode 20, the stopper 80 can be formed on a portion of the upper surface of the first electrode 20 and for example, as shown in FIG. 23A, the stopper 80 can be formed so as to cover the first electrode 20.

Figure 23B:
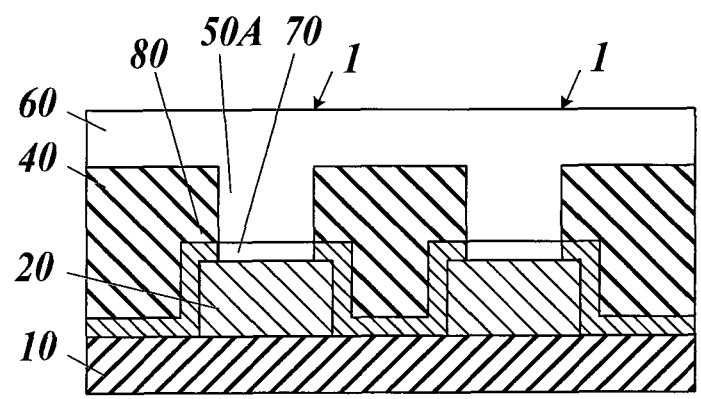
FIG. 23B is a diagram showing an element including nanogap electrodes fabricated by the fabrication method of modification 11.

When the stopper 80 is formed so as to cover the first electrode 20, for example, the nanogap element 1 as shown in FIG. 23B is fabricated.

<Modification 12>

Figure 24:
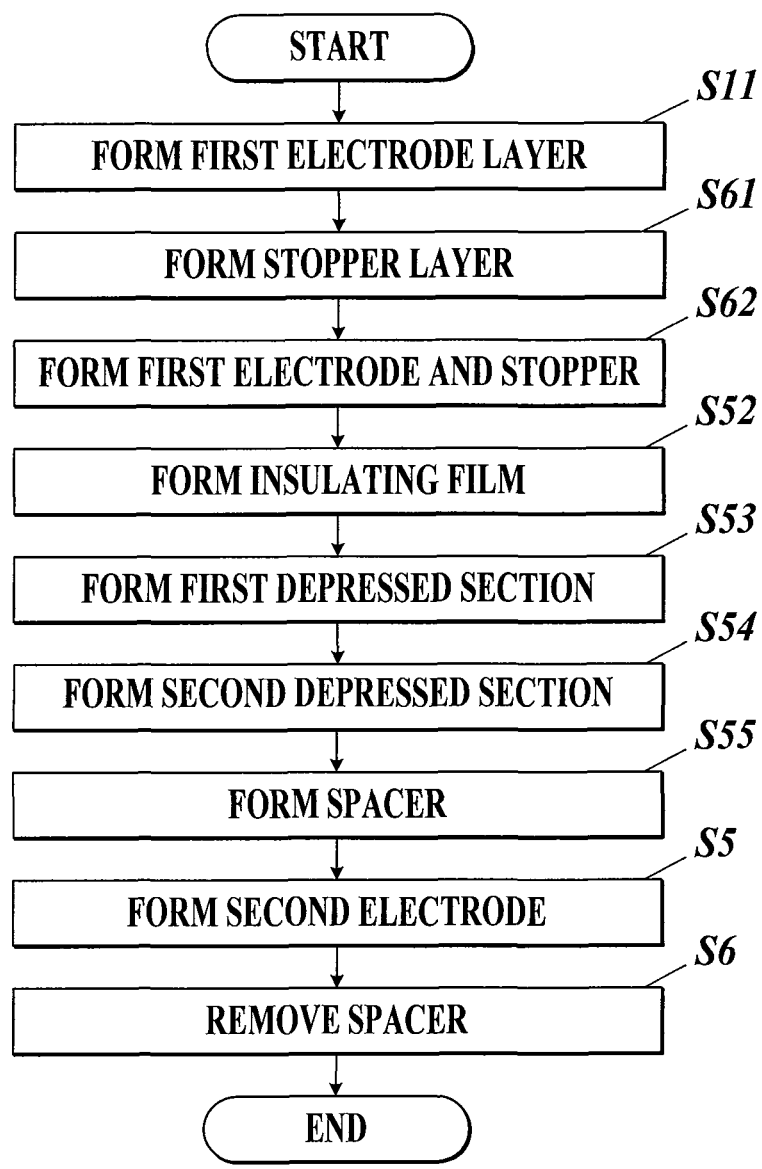
FIG. 24 is a flowchart explaining a fabrication method of modification 12.

The fabrication method of the nanogap element 1 is not limited to the above described embodiment, for example, as shown in FIG. 24, the fabrication method can include the following steps of, [1] first electrode layer forming step (step S11), [2] stopper layer forming step (step S61), [3] first electrode and stopper forming step (step S62), [4] insulating film forming step (step S52), [5] first depressed section forming step (step S53), [6] second depressed section forming step (step S54), [7] spacer forming step (step S55), [8] second electrode forming step (step S5), and [9] spacer removing step (step S6).

[1] First Electrode Layer Forming Step (Step S11)

The first electrode layer forming step is a step to form the first electrode layer 20A, which is to be the first electrode 20, on substantially the entire upper surface of the insulating substrate 10.

[2] Stopper Layer Forming Step (Step S61)

Figure 25A:
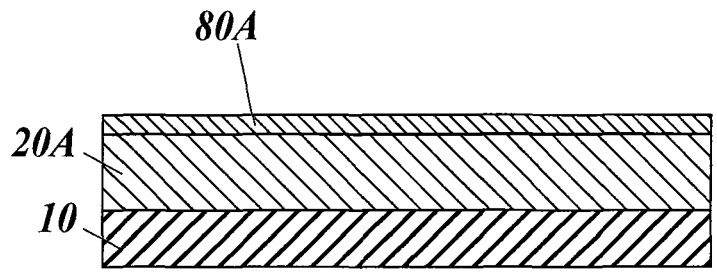
FIG. 25A is a diagram explaining a stopper layer forming step of the fabrication method of modification 12.

For example, as shown in FIG. 25A, the stopper layer forming step is a step to form the stopper layer 80A, which is to be the stopper 80, on the upper surface of the first electrode layer 20A.

[3] First Electrode and Stopper Forming Step (Step S62)

Figure 25B:
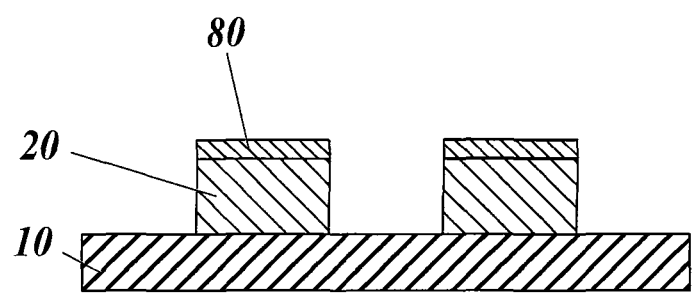
FIG. 25B is a diagram explaining a first electrode and stopper forming step.

For example, as shown in FIG. 25B, the first electrode and stopper forming step is a step to form the stopper 80 and the first electrode 20 including the stopper 80 on its upper surface from the first electrode layer 20A and the stopper layer 80A.

[4] Insulating Film Forming Step (Step S52)

The insulating film forming step is a step to form the insulating film 40 on substantially the entire upper surface of the insulating substrate 10 to cover the stopper 80 and the first electrode 20 including the stopper 80 on its upper surface.

[5] First Depressed Section Forming Step (Step S53)

The first depressed section forming step is a step to form the first depressed section 50A on the insulating film 40 to expose a portion of the upper surface of the stopper 80.

[6] Second Depressed Section Forming Step (Step S54)

The second depressed section forming step is a step to form the second depressed section 50B on the stopper 80 to expose a portion of the upper surface of the first electrode 20.

[7] Spacer Forming Step (Step S55)

The spacer forming step is a step to form the spacer 30 on the upper surface of the first electrode 20 exposed by the second depressed section 50B.

[8] Second Electrode Forming Step (Step S5)

The second electrode forming step is a step to form the second electrode 60 in contact with the upper surface of the spacer 30.

[9] Spacer Removing Step (Step S6)

The spacer removing step is a step to form the gap 70 to remove the spacer 30.

Figure 25C:
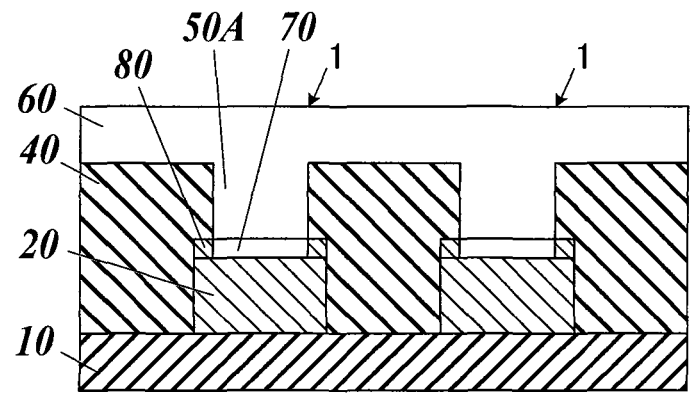
FIG. 25C is a diagram showing an element including nanogap electrodes fabricated by the fabrication method of modification 12.

With this, for example the nanogap element 1 as shown in FIG. 25C is fabricated.

According to the fabrication method of the nanogap element 1 of modification 6 to modification 9, the stopper 80 is formed, the insulating film 40 and the stopper 80 are removed separately and the depressed section to expose the upper surface of the spacer 30 is gradually formed. Consequently, compared to when the stopper 80 is not formed, the damage to the spacer 30 is reduced. Therefore, the gap 70 with a desired size can be formed even better without influence of fabrication variation and higher reproducibility.

Also, according to the fabrication method of the nanogap element 1 of modification 10 to modification 12, the stopper 80 is formed, the insulating film 40 and the stopper 80 are removed separately and the depressed section to expose the upper surface of the first electrode 20 is gradually formed. Consequently, compared to when the stopper 80 is not formed, the damage to the first electrode 20 can be reduced. Therefore, the gap 70 with a desired size can be formed even better without influence of fabrication variation and higher reproducibility.

In the above described embodiment, the depressed section 50 (in other words, groove section) is formed in a line. The shape of the depressed section 50 is not limited to this shape and for example, can be a hole shape.

The same can be said for the depressed section 50 of the above described modifications (including the first depressed section 50A and the second depressed section 50B).

According to a first aspect of the preferred embodiments, there is provided a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method including:
forming the first electrode;
forming a spacer on an upper surface of the first electrode;
forming the second electrode in contact with an upper surface of the spacer; and
removing the spacer to form the gap.

According to a second aspect of the preferred embodiments, there is provided a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method including:
forming a first electrode layer;
forming a spacer layer on an upper surface of the first electrode layer;
forming a spacer and the first electrode including the spacer on an upper surface of the first electrode from the first electrode layer and the spacer layer;
forming the second electrode in contact with an upper surface of the spacer; and
removing the spacer to form the gap.

Preferably, the fabrication method of an element with nanogap electrodes further includes:
forming an insulating film to cover the spacer and the first electrode including the spacer on the upper surface of the first electrode; and
forming a depressed section on the insulating film to expose the upper surface of the spacer, wherein
the second electrode is formed so as to be in contact with the upper surface of the spacer exposed by the depressed section.

Preferably, the fabrication method of an element with nanogap electrodes further includes:
forming an insulating film to cover the first electrode; and
forming a depressed section on the insulating film to expose the upper surface of the first electrode, wherein
the spacer is formed on the upper surface of the first electrode exposed by the depressed section.

Preferably, the fabrication method of an element with nanogap electrodes, further includes:
forming a stopper on the upper surface of the spacer;
forming an insulating film to cover the stopper, the spacer including the stopper on the upper surface of the spacer and the first electrode including the spacer on the upper surface of the first electrode;
forming a first depressed section on the insulating film to expose an upper surface of the stopper; and
forming a second depressed section on the stopper to expose the upper surface of the spacer, wherein
the second electrode is formed so as to be in contact with the upper surface of the spacer exposed by the second depressed section.

Preferably, the fabrication method of an element with nanogap electrodes further includes:
forming a stopper layer on the upper surface of the spacer layer, wherein
a stopper, the spacer including the stopper on the upper surface of the spacer and the first electrode including the spacer on the upper surface of the first electrode are formed from the first electrode layer, the spacer layer and the stopper layer;

forming an insulating film to cover the stopper, the spacer including the stopper on the upper surface of the spacer and the first electrode including the spacer on the upper surface of the first electrode;
forming a first depressed section on the insulating film to expose an upper surface of the stopper; and
forming a second depressed section on the stopper to expose the upper surface of the spacer, wherein
the second electrode is formed so as to be in contact with the upper surface of the spacer exposed by the second depressed section.

Preferably, the fabrication method of an element with nanogap electrodes further includes:
forming a stopper on the upper surface of the first electrode;
forming an insulating film to cover the stopper and the first electrode including the stopper on the upper surface of the first electrode;
forming a first depressed section on the insulating film to expose an upper surface of the stopper; and
forming a second depressed section on the stopper to expose the upper surface of the first electrode, wherein
the spacer is formed on the upper surface of the first electrode exposed by the second depressed section.

According to a third aspect of the preferred embodiments, there is provided a fabrication method of an element with nanogap electrodes including a first electrode, a second electrode provided above the first electrode, and a gap provided between the first electrode and the second electrode, the gap being in an order of nanometer to allow resistive state to be switched by applying a predetermined voltage between the first electrode and the second electrode, the method including:
forming a first electrode layer;
forming a stopper layer on an upper surface of the first electrode layer;
forming a stopper and the first electrode including the stopper on the upper surface of the first electrode from the first electrode layer and the stopper layer;
forming an insulating film to cover the stopper and the first electrode including the stopper on the upper surface of the first electrode;
forming a first depressed section on the insulating film to expose an upper surface of the stopper;
forming a second depressed section on the stopper to expose the upper surface of the first electrode;
forming a spacer on the upper surface of the first electrode exposed by the second depressed section;
forming the second electrode to be in contact with an upper surface of the spacer; and
removing the spacer to form the gap.

Preferably, the spacer is formed by performing a predetermined surface processing on the upper surface of the first electrode.

Preferably, the spacer layer is formed by performing a predetermined surface processing on the upper surface of the first electrode layer.

Preferably, the insulating film includes silicon oxide; the spacer includes silicon nitride; and the spacer is removed using mixed gas including $CF_4$ gas, $O_2$ gas and $N_2$ gas.

According to the above aspects, the thickness of the spacer is to be the distance between the nanogap electrodes (size of the gap provided between the first and the second electrode) and therefore, the gap with the desired size can be formed without influence of fabrication variation and with high reproducibility.

Consequently, the element with a certain distance between the nanogap electrodes can be easily mass produced.

The entire disclosure of Japanese Patent Application No. 2009-095575 filed on Apr. 10, 2009 including description, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A fabrication method of an element with nanogap electrodes including a first electrode, a second electrode provided above the first electrode, and a gap provided between the first electrode and the second electrode, the method comprising:
   forming the first electrode;
   forming a spacer in contact with an upper surface of the first electrode;
   forming a stopper on the upper surface of the spacer;
   forming an insulating film to cover the stopper, the spacer and the first electrode;
   forming a first depressed section on the insulating film to expose an upper surface of the stopper;
   forming a second depressed section on the stopper to expose the upper surface of the spacer;
   forming the second electrode in contact with an upper surface of the spacer exposed by the second depressed section; and
   removing the spacer to form the gap,
   wherein the gap is sized such that a resistive state is changed by a tunnel current that occurs when a predetermined voltage is applied between the first electrode and the second electrode.

2. A fabrication method of an element with nanogap electrodes including a first electrode, a second electrode provided above the first electrode, and a gap provided between the first electrode and the second electrode, the method comprising:
   forming the first electrode;
   forming a stopper on the upper surface of the first electrode;
   forming an insulating film to cover the stopper and the first electrode;
   forming a first depressed section on the insulating film to expose an upper surface of the stopper;
   forming a second depressed section on the stopper to expose the upper surface of the first electrode;
   forming a spacer in contact with an upper surface of the first electrode exposed by the second depressed section;
   forming the second electrode in contact with an upper surface of the spacer; and
   removing the spacer to form the gap,
   wherein the gap is sized such that a resistive state is changed by a tunnel current that occurs when a predetermined voltage is applied between the first electrode and the second electrode.

3. The fabrication method of an element with nanogap electrodes according to claim 1, wherein the spacer is formed by performing a predetermined surface processing on the upper surface of the first electrode.

4. The fabrication method of an element with nanogap electrodes according to claim 1, wherein:
   the insulating film includes silicon oxide;
   the spacer includes silicon nitride; and
   the spacer is removed using mixed gas including $CF_4$ gas, $O_2$ gas and $N_2$ gas.

5. The fabrication method of an element with nanogap electrodes according to claim 1, wherein:
   the first depressed section is formed using an etching gas that etches the insulating film but does not etch the stopper.

6. The fabrication method of an element with nanogap electrodes according to claim 1, wherein:
   the second depressed section is formed using an etching gas that etches the stopper but does not etch the spacer.

7. The fabrication method of an element with nanogap electrodes according to claim 5, wherein:
   the insulating film includes silicon oxide;
   the spacer includes silicon nitride; and
   the etching gas used to form the first depressed section is $C_4F_8$ gas.

8. The fabrication method of an element with nanogap electrodes according to claim 6, wherein:
   the stopper includes aluminum oxide;
   the spacer includes silicon nitride; and
   the etching gas used to form the second depressed section is $Cl_2$ gas.

* * * * *